United States Patent
Bar-Or Tillinger et al.

(10) Patent No.: US 11,923,977 B1
(45) Date of Patent: Mar. 5, 2024

(54) DECODER SUCCESS PREDICTOR SIGNALING FOR ADJUSTING MIRS SCHEDULING POLICY

(71) Applicant: QUALCOMM Incorporated, San Diego, CA (US)

(72) Inventors: Amit Bar-Or Tillinger, Tel-Aviv (IL); Gideon Shlomo Kutz, Ramat Hasharon (IL); Assaf Touboul, Netanya (IL); Tal Oved, Modiin (IL)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/822,560

(22) Filed: Aug. 26, 2022

(51) Int. Cl.
*H04L 1/00* (2006.01)
*H03M 13/00* (2006.01)
*H03M 13/11* (2006.01)

(52) U.S. Cl.
CPC ......... *H04L 1/005* (2013.01); *H03M 13/1105* (2013.01); *H03M 13/611* (2013.01)

(58) Field of Classification Search
CPC .. H04L 1/005; H03M 13/1105; H03M 13/611
See application file for complete search history.

(56) References Cited

U.S. PATENT DOCUMENTS

| | | | | |
|---|---|---|---|---|
| 2006/0222121 A1* | 10/2006 | Uchikawa | ............... | H04L 1/005 375/347 |
| 2010/0125764 A1* | 5/2010 | Kose | .................. | H03M 13/1171 714/704 |
| 2013/0223422 A1* | 8/2013 | Abraham | .............. | H04L 1/0015 370/338 |
| 2014/0351667 A1* | 11/2014 | Gadat | ............... | H03M 13/3753 714/752 |

* cited by examiner

*Primary Examiner* — Thien Nguyen
(74) *Attorney, Agent, or Firm* — QUALCOMM Incorporated

(57) ABSTRACT

A user equipment (UE) may transmit, to a network node, an indication of support for a decoder success prediction capability. The network node may obtain the indication of support by the UE for the decoder success prediction probability. The network node may output a transmission for the UE including one or more parameters based on the indication of support by the UE for the decoder success prediction capability. The UE may receive the transmission including one or more code blocks based on the indication of support for the decoder success prediction capability. The network node may optimize a multiple incremental redundancy scheme (MIRS) schedule for at least one of transmitting the transmission or retransmitting the transmission based on the indication of support by the UE for the decoder success prediction capability. The transmission may include the MIRS schedule.

16 Claims, 11 Drawing Sheets

DECODER SUCCESS PREDICTOR SIGNALING FOR ADJUSTING MIRS SCHEDULING POLICY

TECHNICAL FIELD

The present disclosure relates generally to communication systems, and more particularly, to a multiple incremental redundancy scheme (MIRS) scheduling system.

INTRODUCTION

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. 5G NR includes services associated with enhanced mobile broadband (eMBB), massive machine type communications (mMTC), and ultra-reliable low latency communications (URLLC). Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

BRIEF SUMMARY

The following presents a simplified summary of one or more aspects in order to provide a basic understanding of such aspects. This summary is not an extensive overview of all contemplated aspects. This summary neither identifies key or critical elements of all aspects nor delineates the scope of any or all aspects. Its sole purpose is to present some concepts of one or more aspects in a simplified form as a prelude to the more detailed description that is presented later.

In an aspect of the disclosure, a method, a computer-readable medium, and an apparatus are provided. The apparatus may have a memory and at least one processor coupled to the memory at a user equipment (UE). Based at least in part on information stored in the memory, the at least one processor may be configured to transmit, to a network node, an indication of support for a decoder success prediction capability. Based at least in part on information stored in the memory, the at least one processor may be configured to receive a transmission including one or more code blocks based on the indication of support for the decoder success prediction capability.

In an aspect of the disclosure, a method, a computer-readable medium, and an apparatus are provided. The apparatus may have a memory and at least one processor coupled to the memory at a network node. Based at least in part on information stored in the memory, the at least one processor may be configured to obtain an indication of support by the UE for the decoder success prediction probability. Based at least in part on information stored in the memory, the at least one processor may be configured to output a transmission for the UE including one or more parameters based on the indication of support by the UE for the decoder success prediction capability.

To the accomplishment of the foregoing and related ends, the one or more aspects include the features hereinafter fully described and particularly pointed out in the claims. The following description and the drawings set forth in detail certain illustrative features of the one or more aspects. These features are indicative, however, of but a few of the various ways in which the principles of various aspects may be employed.

DETAILED DESCRIPTION

Figure 1:
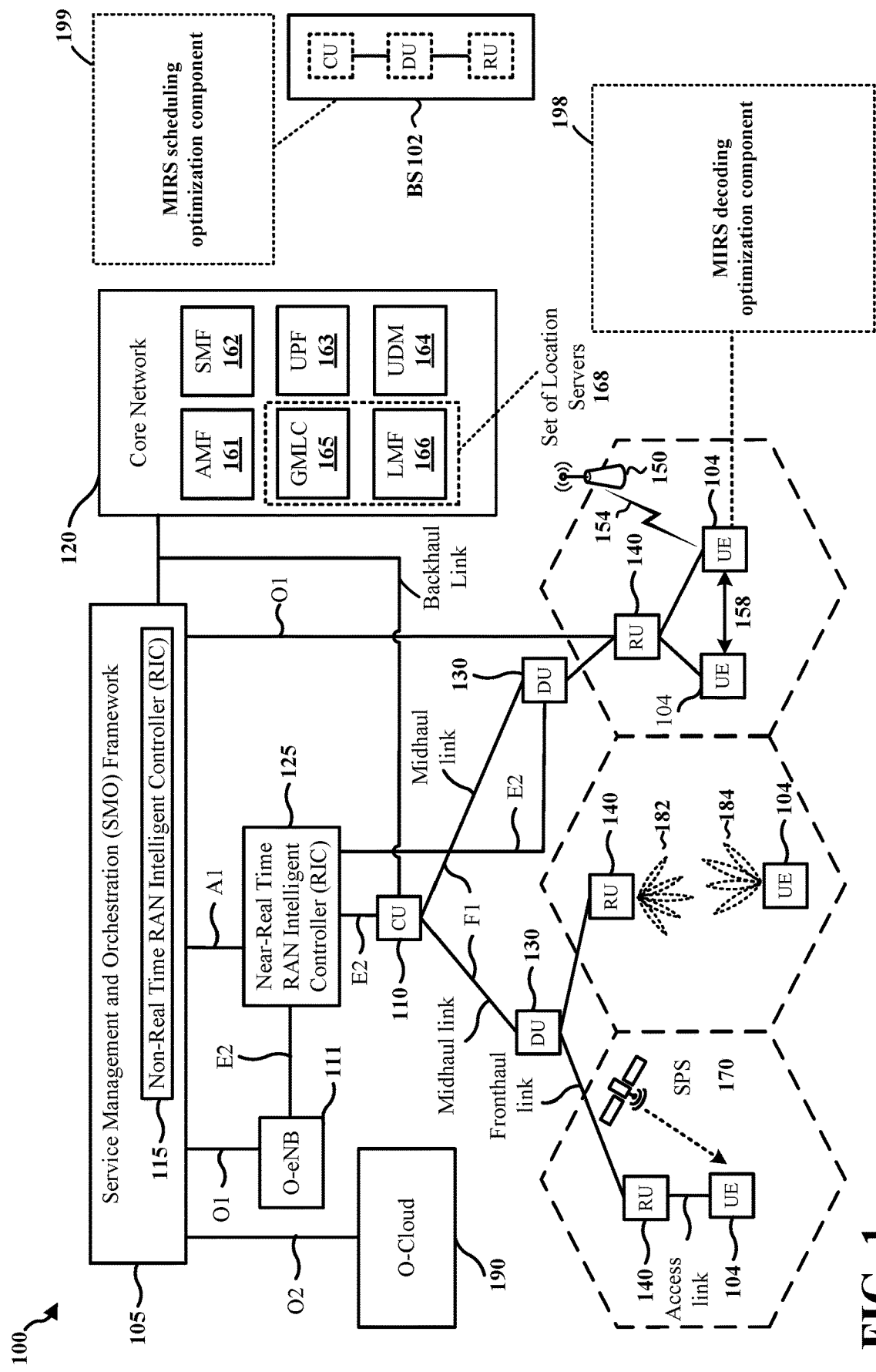
FIG. 1 is a diagram illustrating an example of a wireless communications system and an access network.

MIRS systems may provide a rate, precoding, and rank adaptation scheme based on one or more incremental redundancy (IR) hybrid automatic repeat request (IR-HARQ) re-transmissions. MIRS may be used to select an optimal modulation and coding scheme (MCS) and achieve communication with a user equipment (UE) at a capacity code rate, regardless of the mobility of the UE. However, since MIRS-based rate adaptation system may have a large number of unsuccessful decoding attempts, the LDPC power efficiency of a MIRS scheme may consume more power than a non-MIRS scheme.

A decoder success predictor method may be used to enable a UE to accurately identify code blocks that are likely to fail LDPC decoding. Such a UE may avoid decoding such identified code blocks, resulting in a significant reduction of power consumption and hardware dimensioning when using a MIRS scheme. The UE may signal its decoder success prediction capability to a network node. Based on the received signaling, the network node may also optimize scheduling MIRS retransmissions.

A UE may transmit, to a network node, an indication of support for a decoder success prediction capability. The network node may obtain the indication of support by the UE for the decoder success prediction probability. The network node may output a transmission for the UE including one or more parameters based on the indication of support by the UE for the decoder success prediction capability. The UE may receive the transmission including one or more code blocks based on the indication of support for the decoder success prediction capability. The network node may optimize a MIRS schedule for at least one of transmitting the transmission or retransmitting the transmission based on the indication of support by the UE for the decoder success prediction capability. The transmission may include the MIRS schedule.

The detailed description set forth below in connection with the drawings describes various configurations and does not represent the only configurations in which the concepts described herein may be practiced. The detailed description includes specific details for the purpose of providing a thorough understanding of various concepts. However, these concepts may be practiced without these specific details. In some instances, well known structures and components are shown in block diagram form in order to avoid obscuring such concepts.

Several aspects of telecommunication systems are presented with reference to various apparatus and methods. These apparatus and methods are described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software, whether referred to as software, firmware, middleware, microcode, hardware description language, or otherwise, shall be construed broadly to mean instructions, instruction sets, code, code segments, program code, programs, subprograms, software components, applications, software applications, software packages, routines, subroutines, objects, executables, threads of execution, procedures, functions, or any combination thereof.

Accordingly, in one or more example aspects, implementations, and/or use cases, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, such computer-readable media can include a random-access memory (RAM), a read-only memory (ROM), an electrically erasable programmable ROM (EEPROM), optical disk storage, magnetic disk storage, other magnetic storage devices, combinations of the types of computer-readable media, or any other medium that can be used to store computer executable code in the form of instructions or data structures that can be accessed by a computer.

While aspects, implementations, and/or use cases are described in this application by illustration to some examples, additional or different aspects, implementations and/or use cases may come about in many different arrangements and scenarios. Aspects, implementations, and/or use cases described herein may be implemented across many differing platform types, devices, systems, shapes, sizes, and packaging arrangements. For example, aspects, implementations, and/or use cases may come about via integrated chip implementations and other non-module-component based devices (e.g., end-user devices, vehicles, communication devices, computing devices, industrial equipment, retail/purchasing devices, medical devices, artificial intelligence (AI)-enabled devices, etc.). While some examples may or may not be specifically directed to use cases or applications, a wide assortment of applicability of described examples may occur. Aspects, implementations, and/or use cases may range a spectrum from chip-level or modular components to non-modular, non-chip-level implementations and further to aggregate, distributed, or original equipment manufacturer (OEM) devices or systems incorporating one or more techniques herein. In some practical settings, devices incorporating described aspects and features may also include additional components and features for implementation and practice of claimed and described aspect. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). Techniques described herein may be practiced in a wide variety of devices, chip-level components, systems, distributed arrangements, aggregated or disaggregated components, end-user devices, etc. of varying sizes, shapes, and constitution.

Deployment of communication systems, such as 5G NR systems, may be arranged in multiple manners with various components or constituent parts. In a 5G NR system, or network, a network node, a network entity, a mobility element of a network, a radio access network (RAN) node, a core network node, a network element, or a network equipment, such as a base station (BS), or one or more units (or one or more components) performing base station functionality, may be implemented in an aggregated or disaggregated architecture. For example, a BS (such as a Node B (NB), evolved NB (eNB), NR BS, 5G NB, access point (AP), a transmit receive point (TRP), or a cell, etc.) may be implemented as an aggregated base station (also known as a standalone BS or a monolithic BS) or a disaggregated base station.

An aggregated base station may be configured to utilize a radio protocol stack that is physically or logically integrated within a single RAN node. A disaggregated base station may be configured to utilize a protocol stack that is physically or logically distributed among two or more units (such as one or more central or centralized units (CUs), one or more distributed units (DUs), or one or more radio units (RUs)). In some aspects, a CU may be implemented within a RAN node, and one or more DUs may be co-located with the CU, or alternatively, may be geographically or virtually distributed throughout one or multiple other RAN nodes. The DUs may be implemented to communicate with one or more RUs. Each of the CU, DU and RU can be implemented as virtual units, i.e., a virtual central unit (VCU), a virtual distributed unit (VDU), or a virtual radio unit (VRU).

Base station operation or network design may consider aggregation characteristics of base station functionality. For example, disaggregated base stations may be utilized in an integrated access backhaul (IAB) network, an open radio access network (O-RAN (such as the network configuration sponsored by the O-RAN Alliance)), or a virtualized radio access network (vRAN, also known as a cloud radio access network (C-RAN)). Disaggregation may include distributing functionality across two or more units at various physical locations, as well as distributing functionality for at least one unit virtually, which can enable flexibility in network design. The various units of the disaggregated base station, or disaggregated RAN architecture, can be configured for wired or wireless communication with at least one other unit.

FIG. 1 is a diagram 100 illustrating an example of a wireless communications system and an access network. The illustrated wireless communications system includes a disaggregated base station architecture. The disaggregated base station architecture may include one or more CUs 110 that can communicate directly with a core network 120 via a backhaul link, or indirectly with the core network 120 through one or more disaggregated base station units (such as a Near-Real Time (Near-RT) RAN Intelligent Controller (RIC) 125 via an E2 link, or a Non-Real Time (Non-RT) RIC 115 associated with a Service Management and Orchestration (SMO) Framework 105, or both). A CU 110 may communicate with one or more DUs 130 via respective midhaul links, such as an F1 interface. The DUs 130 may communicate with one or more RUs 140 via respective fronthaul links. The RUs 140 may communicate with respective UEs 104 via one or more radio frequency (RF) access links. In some implementations, the UE 104 may be simultaneously served by multiple RUs 140.

Each of the units, i.e., the CUs 110, the DUs 130, the RUs 140, as well as the Near-RT RICs 125, the Non-RT RICs 115, and the SMO Framework 105, may include one or more interfaces or be coupled to one or more interfaces configured to receive or to transmit signals, data, or information (collectively, signals) via a wired or wireless transmission medium. Each of the units, or an associated processor or controller providing instructions to the communication interfaces of the units, can be configured to communicate with one or more of the other units via the transmission medium. For example, the units can include a wired interface configured to receive or to transmit signals over a wired transmission medium to one or more of the other units. Additionally, the units can include a wireless interface, which may include a receiver, a transmitter, or a transceiver (such as an RF transceiver), configured to receive or to transmit signals, or both, over a wireless transmission medium to one or more of the other units.

In some aspects, the CU 110 may host one or more higher layer control functions. Such control functions can include radio resource control (RRC), packet data convergence protocol (PDCP), service data adaptation protocol (SDAP), or the like. Each control function can be implemented with an interface configured to communicate signals with other control functions hosted by the CU 110. The CU 110 may be configured to handle user plane functionality (i.e., Central Unit-User Plane (CU-UP)), control plane functionality (i.e., Central Unit-Control Plane (CU-CP)), or a combination thereof. In some implementations, the CU 110 can be logically split into one or more CU-UP units and one or more CU-CP units. The CU-UP unit can communicate bidirectionally with the CU-CP unit via an interface, such as an E1 interface when implemented in an O-RAN configuration. The CU 110 can be implemented to communicate with the DU 130, as necessary, for network control and signaling.

The DU 130 may correspond to a logical unit that includes one or more base station functions to control the operation of one or more RUs 140. In some aspects, the DU 130 may host one or more of a radio link control (RLC) layer, a medium access control (MAC) layer, and one or more high physical (PHY) layers (such as modules for forward error correction (FEC) encoding and decoding, scrambling, modulation, demodulation, or the like) depending, at least in part, on a functional split, such as those defined by 3GPP. In some aspects, the DU 130 may further host one or more low PHY layers. Each layer (or module) can be implemented with an interface configured to communicate signals with other layers (and modules) hosted by the DU 130, or with the control functions hosted by the CU 110.

Lower-layer functionality can be implemented by one or more RUs 140. In some deployments, an RU 140, controlled by a DU 130, may correspond to a logical node that hosts RF processing functions, or low-PHY layer functions (such as performing fast Fourier transform (FFT), inverse FFT (iFFT), digital beamforming, physical random access channel (PRACH) extraction and filtering, or the like), or both, based at least in part on the functional split, such as a lower layer functional split. In such an architecture, the RU(s) 140 can be implemented to handle over the air (OTA) communication with one or more UEs 104. In some implementations, real-time and non-real-time aspects of control and user plane communication with the RU(s) 140 can be controlled by the corresponding DU 130. In some scenarios, this configuration can enable the DU(s) 130 and the CU 110 to be implemented in a cloud-based RAN architecture, such as a vRAN architecture.

The SMO Framework 105 may be configured to support RAN deployment and provisioning of non-virtualized and virtualized network elements. For non-virtualized network elements, the SMO Framework 105 may be configured to support the deployment of dedicated physical resources for RAN coverage requirements that may be managed via an operations and maintenance interface (such as an O1 interface). For virtualized network elements, the SMO Framework 105 may be configured to interact with a cloud computing platform (such as an open cloud (O-Cloud) 190) to perform network element life cycle management (such as to instantiate virtualized network elements) via a cloud computing platform interface (such as an O2 interface). Such virtualized network elements can include, but are not limited to, CUs 110, DUs 130, RUs 140 and Near-RT RICs 125. In some implementations, the SMO Framework 105 can communicate with a hardware aspect of a 4G RAN, such as an open eNB (O-eNB) 111, via an O1 interface. Additionally, in some implementations, the SMO Framework 105 can communicate directly with one or more RUs 140 via an O1 interface. The SMO Framework 105 also may include a Non-RT RIC 115 configured to support functionality of the SMO Framework 105.

The Non-RT RIC 115 may be configured to include a logical function that enables non-real-time control and optimization of RAN elements and resources, artificial intelligence (AI)/machine learning (ML) (AI/ML) workflows including model training and updates, or policy-based guidance of applications/features in the Near-RT RIC 125. The Non-RT RIC 115 may be coupled to or communicate with (such as via an A1 interface) the Near-RT RIC 125. The Near-RT RIC 125 may be configured to include a logical function that enables near-real-time control and optimization of RAN elements and resources via data collection and actions over an interface (such as via an E2 interface) connecting one or more CUs 110, one or more DUs 130, or both, as well as an O-eNB, with the Near-RT RIC 125.

In some implementations, to generate AI/ML models to be deployed in the Near-RT RIC 125, the Non-RT RIC 115 may receive parameters or external enrichment information from external servers. Such information may be utilized by the Near-RT RIC 125 and may be received at the SMO Framework 105 or the Non-RT RIC 115 from non-network data sources or from network functions. In some examples, the Non-RT RIC 115 or the Near-RT RIC 125 may be configured to tune RAN behavior or performance. For example, the Non-RT RIC 115 may monitor long-term trends and patterns for performance and employ AI/ML models to perform corrective actions through the SMO Framework 105 (such as reconfiguration via 01) or via creation of RAN management policies (such as A1 policies).

At least one of the CU 110, the DU 130, and the RU 140 may be referred to as a base station 102. Accordingly, a base station 102 may include one or more of the CU 110, the DU 130, and the RU 140 (each component indicated with dotted lines to signify that each component may or may not be included in the base station 102). The base station 102 provides an access point to the core network 120 for a UE 104. The base stations 102 may include macrocells (high power cellular base station) and/or small cells (low power cellular base station). The small cells include femtocells, picocells, and microcells. A network that includes both small cell and macrocells may be known as a heterogeneous network. A heterogeneous network may also include Home Evolved Node Bs (eNBs) (HeNBs), which may provide service to a restricted group known as a closed subscriber group (CSG). The communication links between the RUs 140 and the UEs 104 may include uplink (UL) (also referred to as reverse link) transmissions from a UE 104 to an RU 140 and/or downlink (DL) (also referred to as forward link) transmissions from an RU 140 to a UE 104. The communication links may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100, 400, etc. MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or fewer carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 104 may communicate with each other using device-to-device (D2D) communication link 158. The D2D communication link 158 may use the DL/UL wireless wide area network (WWAN) spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, Bluetooth, Wi-Fi based on the Institute of Electrical and Electronics Engineers (IEEE) 802.11 standard, LTE, or NR.

The wireless communications system may further include a Wi-Fi AP 150 in communication with UEs 104 (also referred to as Wi-Fi stations (STAs)) via communication link 154, e.g., in a 5 GHz unlicensed frequency spectrum or the like. When communicating in an unlicensed frequency spectrum, the UEs 104/AP 150 may perform a clear channel assessment (CCA) prior to communicating in order to determine whether the channel is available.

The electromagnetic spectrum is often subdivided, based on frequency/wavelength, into various classes, bands, channels, etc. In 5G NR, two initial operating bands have been identified as frequency range designations FR1 (410 MHz-7.125 GHz) and FR2 (24.25 GHz-52.6 GHz). Although a portion of FR1 is greater than 6 GHz, FR1 is often referred to (interchangeably) as a "sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

The frequencies between FR1 and FR2 are often referred to as mid-band frequencies. Recent 5G NR studies have identified an operating band for these mid-band frequencies as frequency range designation FR3 (7.125 GHz-24.25 GHz). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR2-2 (52.6 GHz-71 GHz), FR4 (71 GHz-114.25 GHz), and FR5 (114.25 GHz-300 GHz). Each of these higher frequency bands falls within the EHF band.

With the above aspects in mind, unless specifically stated otherwise, the term "sub-6 GHz" or the like if used herein may broadly represent frequencies that may be less than 6 GHz, may be within FR1, or may include mid-band frequencies. Further, unless specifically stated otherwise, the term "millimeter wave" or the like if used herein may broadly represent frequencies that may include mid-band frequencies, may be within FR2, FR4, FR2-2, and/or FR5, or may be within the EHF band.

The base station 102 and the UE 104 may each include a plurality of antennas, such as antenna elements, antenna panels, and/or antenna arrays to facilitate beamforming. The base station 102 may transmit a beamformed signal 182 to the UE 104 in one or more transmit directions. The UE 104 may receive the beamformed signal from the base station 102 in one or more receive directions. The UE 104 may also transmit a beamformed signal 184 to the base station 102 in one or more transmit directions. The base station 102 may receive the beamformed signal from the UE 104 in one or more receive directions. The base station 102/UE 104 may perform beam training to determine the best receive and transmit directions for each of the base station 102/UE 104. The transmit and receive directions for the base station 102 may or may not be the same. The transmit and receive directions for the UE 104 may or may not be the same.

The base station 102 may include and/or be referred to as a gNB, Node B, eNB, an access point, a base transceiver station, a radio base station, a radio transceiver, a transceiver function, a basic service set (BSS), an extended service set (ESS), a transmit reception point (TRP), network node, network entity, network equipment, or some other suitable terminology. The base station 102 can be implemented as an integrated access and backhaul (IAB) node, a relay node, a sidelink node, an aggregated (monolithic) base station with a baseband unit (BBU) (including a CU and a DU) and an RU, or as a disaggregated base station including one or more of a CU, a DU, and/or an RU. The set of base stations, which may include dis aggregated base stations and/or aggregated base stations, may be referred to as next generation (NG) RAN (NG-RAN).

The core network 120 may include an Access and Mobility Management Function (AMF) 161, a Session Management Function (SMF) 162, a User Plane Function (UPF) 163, a Unified Data Management (UDM) 164, one or more location servers 168, and other functional entities. The AMF 161 is the control node that processes the signaling between the UEs 104 and the core network 120. The AMF 161 supports registration management, connection management, mobility management, and other functions. The SMF 162 supports session management and other functions. The UPF 163 supports packet routing, packet forwarding, and other functions. The UDM 164 supports the generation of authentication and key agreement (AKA) credentials, user identification handling, access authorization, and subscription management. The one or more location servers 168 are illustrated as including a Gateway Mobile Location Center (GMLC) 165 and a Location Management Function (LMF) 166. However, generally, the one or more location servers 168 may include one or more location/positioning servers, which may include one or more of the GMLC 165, the LMF 166, a position determination entity (PDE), a serving mobile location center (SMLC), a mobile positioning center (MPC), or the like. The GMLC 165 and the LMF 166 support UE location services. The GMLC 165 provides an interface for clients/applications (e.g., emergency services) for accessing UE positioning information. The LMF 166 receives measurements and assistance information from the NG-RAN and the UE 104 via the AMF 161 to compute the position of the UE 104. The NG-RAN may utilize one or more positioning methods in order to determine the position of the UE 104. Positioning the UE 104 may involve signal measurements, a position estimate, and an optional velocity computation based on the measurements. The signal measurements may be made by the UE 104 and/or the serving base station 102. The signals measured may be based on one or more of a satellite positioning system (SPS) 170 (e.g., one or more of a Global Navigation Satellite System (GNSS), global position system (GPS), non-terrestrial network (NTN), or other satellite position/location system), LTE signals, wireless local area network (WLAN) signals, Bluetooth signals, a terrestrial beacon system (TBS), sensor-based information (e.g., barometric pressure sensor, motion sensor), NR enhanced cell ID (NR E-CID) methods, NR signals (e.g., multi-round trip time (Multi-RTT), DL angle-of-departure (DL-AoD), DL time difference of arrival (DL-TDOA), UL time difference of arrival (UL-TDOA), and UL angle-of-arrival (UL-AoA) positioning), and/or other systems/signals/sensors.

Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a large or small kitchen appliance, a healthcare device, an implant, a sensor/actuator, a display, or any other similar functioning device. Some of the UEs 104 may be referred to as IoT devices (e.g., parking meter, gas pump, toaster, vehicles, heart monitor, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. In some scenarios, the term UE may also apply to one or more companion devices such as in a device constellation arrangement. One or more of these devices may collectively access the network and/or individually access the network.

Referring again to FIG. 1, in certain aspects, the UE 104 may have a multiple incremental redundancy scheme (MIRS) decoding optimization component 198 configured to transmit, to a network node, an indication of support for a decoder success prediction capability. The MIRS decoding optimization component may be configured to receive a transmission including one or more code blocks based on the indication of support for the decoder success prediction capability. In certain aspects, the base station 102 may have a MIRS scheduling optimization component 199 configured to obtain an indication of support by the UE for the decoder success prediction probability. The MIRS scheduling optimization component 199 may be configured to output a transmission for the UE including one or more parameters based on the indication of support by the UE for the decoder success prediction capability. Although the following description may be focused on optimizing scheduling and decoding of MIRS retransmissions, the concepts described herein may be applicable to other similar areas, such as any transmission scheduling and decoding optimization scheme. Although the following description may be focused on 5G NR, the concepts described herein may be applicable to other similar areas, such as LTE, LTE-A, CDMA, GSM, and other wireless technologies.

Figures 2A, 2B, 2C, 2D:
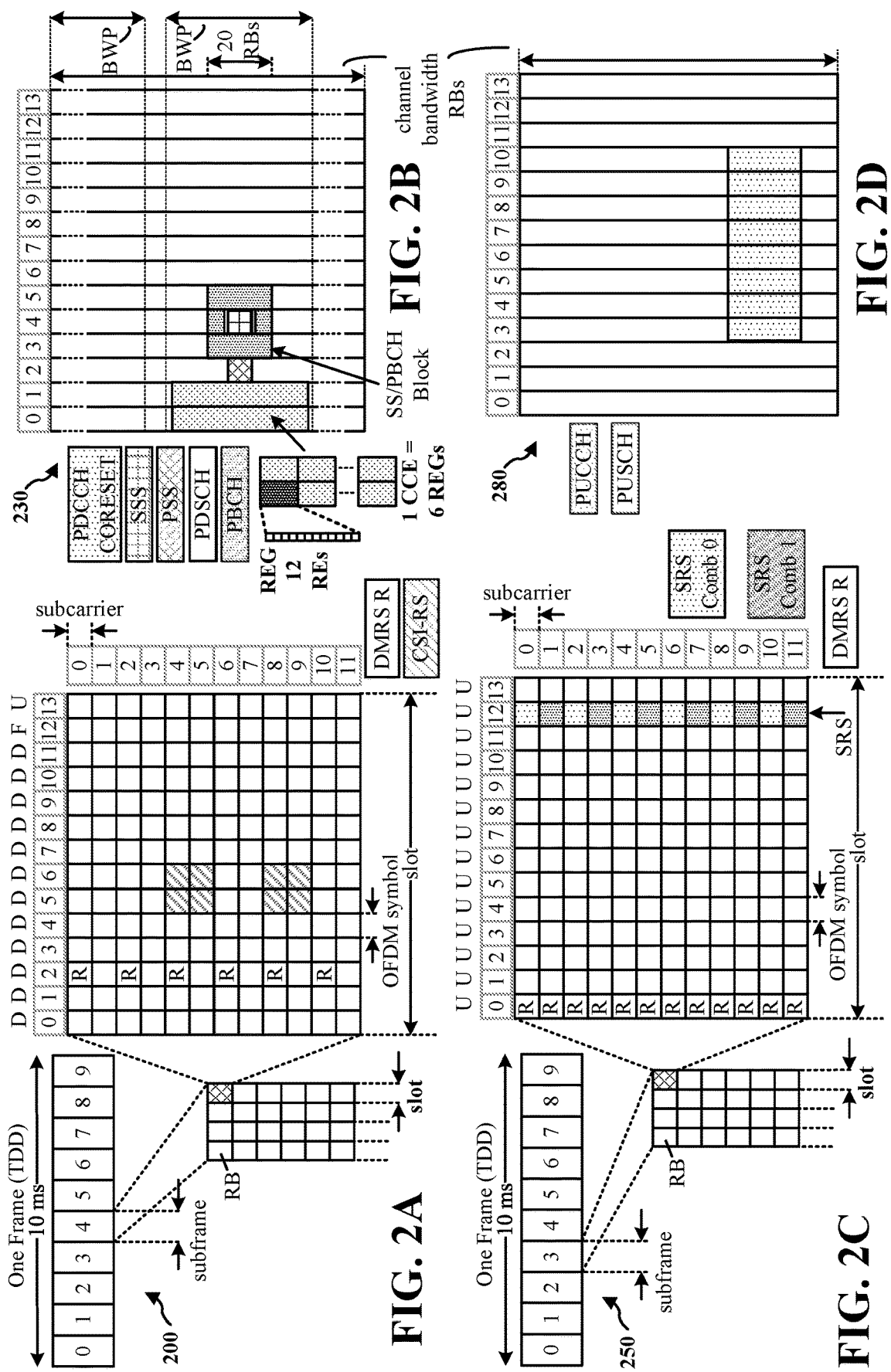
FIG. 2A is a diagram illustrating an example of a first frame, in accordance with various aspects of the present disclosure.
FIG. 2B is a diagram illustrating an example of DL channels within a subframe, in accordance with various aspects of the present disclosure.
FIG. 2C is a diagram illustrating an example of a second frame, in accordance with various aspects of the present disclosure.
FIG. 2D is a diagram illustrating an example of UL channels within a subframe, in accordance with various aspects of the present disclosure.

FIG. 2A is a diagram 200 illustrating an example of a first subframe within a 5G NR frame structure. FIG. 2B is a diagram 230 illustrating an example of DL channels within a 5G NR subframe. FIG. 2C is a diagram 250 illustrating an example of a second subframe within a 5G NR frame structure. FIG. 2D is a diagram 280 illustrating an example of UL channels within a 5G NR subframe. The 5G NR frame structure may be frequency division duplexed (FDD) in which for a particular set of subcarriers (carrier system bandwidth), subframes within the set of subcarriers are dedicated for either DL or UL, or may be time division duplexed (TDD) in which for a particular set of subcarriers (carrier system bandwidth), subframes within the set of subcarriers are dedicated for both DL and UL. In the examples provided by FIGS. 2A, 2C, the 5G NR frame structure is assumed to be TDD, with subframe 4 being configured with slot format 28 (with mostly DL), where D is DL, U is UL, and F is flexible for use between DL/UL, and subframe 3 being configured with slot format 1 (with all UL). While subframes 3, 4 are shown with slot formats 1, 28, respectively, any particular subframe may be configured with any of the various available slot formats 0-61. Slot formats 0, 1 are all DL, UL, respectively. Other slot formats 2-61 include a mix of DL, UL, and flexible symbols. UEs are configured with the slot format (dynamically through DL control information (DCI), or semi-statically/statically through radio resource control (RRC) signaling) through a received slot format indicator (SFI). Note that the description infra applies also to a 5G NR frame structure that is TDD.

FIGS. 2A-2D illustrate a frame structure, and the aspects of the present disclosure may be applicable to other wireless communication technologies, which may have a different frame structure and/or different channels. A frame (10 ms) may be divided into 10 equally sized subframes (1 ms). Each subframe may include one or more time slots. Subframes may also include mini-slots, which may include 7, 4, or 2 symbols. Each slot may include 14 or 12 symbols, depending on whether the cyclic prefix (CP) is normal or extended. For normal CP, each slot may include 14 symbols, and for extended CP, each slot may include 12 symbols. The symbols on DL may be CP orthogonal frequency division multiplexing (OFDM) (CP-OFDM) symbols. The symbols on UL may be CP-OFDM symbols (for high throughput scenarios) or discrete Fourier transform (DFT) spread OFDM (DFT-s-OFDM) symbols (also referred to as single carrier frequency-division multiple access (SC-FDMA) symbols) (for power limited scenarios; limited to a single stream transmission). The number of slots within a subframe is based on the CP and the numerology. The numerology defines the subcarrier spacing (SCS) and, effectively, the symbol length/duration, which is equal to 1/SCS.

| μ | SCS $\Delta f = 2^\mu \cdot 15$ [kHz] | Cyclic prefix |
|---|---|---|
| 0 | 15 | Normal |
| 1 | 30 | Normal |
| 2 | 60 | Normal, Extended |
| 3 | 120 | Normal |
| 4 | 240 | Normal |

For normal CP (14 symbols/slot), different numerologies μ 0 to 4 allow for 1, 2, 4, 8, and 16 slots, respectively, per subframe. For extended CP, the numerology 2 allows for 4 slots per subframe. Accordingly, for normal CP and numerology ii, there are 14 symbols/slot and $2^\mu$ slots/subframe. The subcarrier spacing may be equal to $2^\mu*kHz$, where μ is the numerology 0 to 4. As such, the numerology μ=0 has a subcarrier spacing of 15 kHz and the numerology μ=4 has a subcarrier spacing of 240 kHz. The symbol length/duration is inversely related to the subcarrier spacing. FIGS. 2A-2D provide an example of normal CP with 14 symbols per slot and numerology μ=2 with 4 slots per subframe. The slot duration is 0.25 ms, the subcarrier spacing is kHz, and the symbol duration is approximately 16.67 μs. Within a set of frames, there may be one or more different bandwidth parts (BWPs) (see FIG. 2B) that are frequency division multiplexed. Each BWP may have a particular numerology and CP (normal or extended).

A resource grid may be used to represent the frame structure. Each time slot includes a resource block (RB) (also referred to as physical RBs (PRBs)) that extends 12 consecutive subcarriers. The resource grid is divided into multiple resource elements (REs). The number of bits carried by each RE depends on the modulation scheme.

As illustrated in FIG. 2A, some of the REs carry reference (pilot) signals (RS) for the UE. The RS may include demodulation RS (DM-RS) (indicated as R for one particular configuration, but other DM-RS configurations are possible) and channel state information reference signals (CSI-RS) for channel estimation at the UE. The RS may also include beam measurement RS (BRS), beam refinement RS (BRRS), and phase tracking RS (PT-RS).

FIG. 2B illustrates an example of various DL channels within a subframe of a frame. The physical downlink control channel (PDCCH) carries DCI within one or more control channel elements (CCEs) (e.g., 1, 2, 4, 8, or 16 CCEs), each CCE including six RE groups (REGs), each REG including 12 consecutive REs in an OFDM symbol of an RB. A PDCCH within one BWP may be referred to as a control resource set (CORESET). A UE is configured to monitor PDCCH candidates in a PDCCH search space (e.g., common search space, UE-specific search space) during PDCCH monitoring occasions on the CORESET, where the PDCCH candidates have different DCI formats and different aggregation levels. Additional BWPs may be located at greater and/or lower frequencies across the channel bandwidth. A primary synchronization signal (PSS) may be within symbol 2 of particular subframes of a frame. The PSS is used by a UE 104 to determine subframe/symbol timing and a physical layer identity. A secondary synchronization signal (SSS) may be within symbol 4 of particular subframes of a frame. The SSS is used by a UE to determine a physical layer cell identity group number and radio frame timing. Based on the physical layer identity and the physical layer cell identity group number, the UE can determine a physical cell identifier (PCI). Based on the PCI, the UE can determine the locations of the DM-RS. The physical broadcast channel (PBCH), which carries a master information block (MIB), may be logically grouped with the PSS and SSS to form a synchronization signal (SS)/PBCH block (also referred to as SS block (SSB)). The MIB provides a number of RBs in the system bandwidth and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry DM-RS (indicated as R for one particular configuration, but other DM-RS configurations are possible) for channel estimation at the base station. The UE may transmit DM-RS for the physical uplink control channel (PUCCH) and DM-RS for the physical uplink shared channel (PUSCH). The PUSCH DM-RS may be transmitted in the first one or two symbols of the PUSCH. The PUCCH DM-RS may be transmitted in different configurations depending on whether short or long PUCCHs are transmitted and depending on the particular PUCCH format used. The UE may transmit sounding reference signals (SRS). The SRS may be transmitted in the last symbol of a subframe. The SRS may have a comb structure, and a UE may transmit SRS on one of the combs. The SRS may be used by a base station for channel quality estimation to enable frequency-dependent scheduling on the UL.

FIG. 2D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and hybrid automatic repeat request (HARQ) acknowledgment (ACK) (HARQ-ACK) feedback (i.e., one or more HARQ ACK bits indicating one or more ACK and/or negative ACK (NACK)). The PUSCH carries data, and may additionally be used to carry a buffer status report (BSR), a power headroom report (PHR), and/or UCI.

Figure 3:
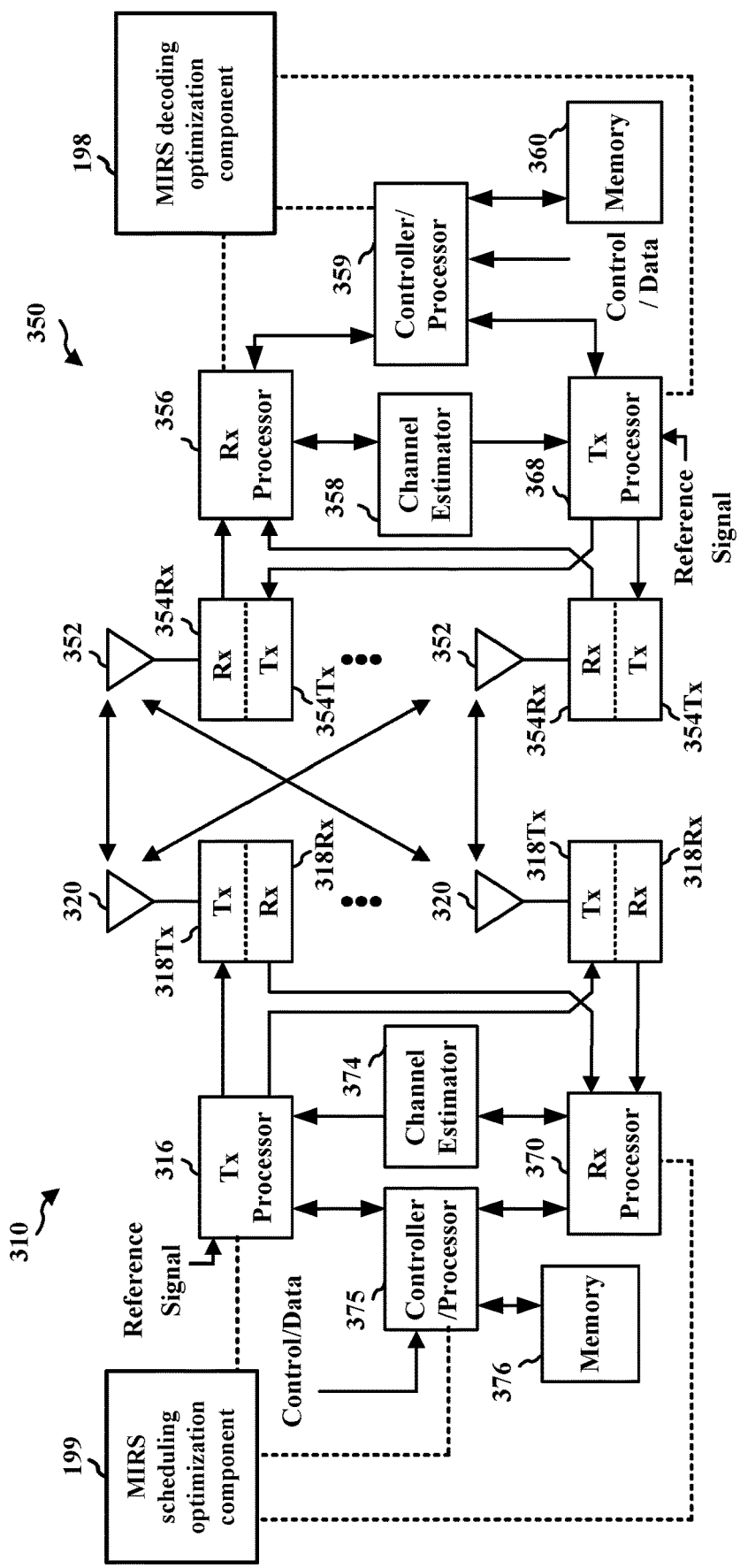
FIG. 3 is a diagram illustrating an example of a base station and user equipment (UE) in an access network.

FIG. 3 is a block diagram of a base station 310 in communication with a UE 350 in an access network. In the DL, Internet protocol (IP) packets may be provided to a controller/processor 375. The controller/processor 375 implements layer 3 and layer 2 functionality. Layer 3 includes a radio resource control (RRC) layer, and layer 2 includes a service data adaptation protocol (SDAP) layer, a packet data convergence protocol (PDCP) layer, a radio link control (RLC) layer, and a medium access control (MAC) layer. The controller/processor 375 provides RRC layer functionality associated with broadcasting of system information (e.g., MIB, SIB s), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (Tx) processor 316 and the receive (Rx) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The Tx processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318Tx. Each transmitter 318Tx may modulate a radio frequency (RF) carrier with a respective spatial stream for transmission.

At the UE 350, each receiver 354Rx receives a signal through its respective antenna 352. Each receiver 354Rx recovers information modulated onto an RF carrier and provides the information to the receive (Rx) processor 356. The Tx processor 368 and the Rx processor 356 implement layer 1 functionality associated with various signal processing functions. The Rx processor 356 may perform spatial processing on the information to recover any spatial streams destined for the UE 350. If multiple spatial streams are destined for the UE 350, they may be combined by the Rx processor 356 into a single OFDM symbol stream. The Rx processor 356 then converts the OFDM symbol stream from the time-domain to the frequency domain using a Fast Fourier Transform (FFT). The frequency domain signal includes a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIB s) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the Tx processor 368 to select the appropriate coding and modulation schemes, and to facilitate spatial processing. The spatial streams generated by the Tx processor 368 may be provided to different antenna 352 via separate transmitters 354Tx. Each transmitter 354Tx may modulate an RF carrier with a respective spatial stream for transmission.

The UL transmission is processed at the base station 310 in a manner similar to that described in connection with the receiver function at the UE 350. Each receiver 318Rx receives a signal through its respective antenna 320. Each receiver 318Rx recovers information modulated onto an RF carrier and provides the information to a Rx processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets. The controller/processor 375 is also responsible for error detection using an ACK and/or NACK protocol to support HARQ operations.

At least one of the Tx processor 368, the Rx processor 356, and the controller/processor 359 may be configured to perform aspects in connection with the MIRS decoding optimization component 198 of FIG. 1.

At least one of the Tx processor 316, the Rx processor 370, and the controller/processor 375 may be configured to perform aspects in connection with the MIRS scheduling optimization component 199 of FIG. 1.

MIRS systems may provide a rate, precoding, and rank adaptation scheme based on one or more incremental redundancy (IR) hybrid automatic repeat request (IR-HARQ) re-transmissions. MIRS may be used to select an optimal modulation and coding scheme (MCS) and achieve communication with a user equipment (UE) at a capacity code rate, regardless of the mobility of the UE. Such systems may provide gains over CSI-RS based systems that may be used to select an optimal MCS based on an evaluated channel condition, SNR, and/or rank of a channel determined using one or more CSI-RS s. In some aspects, a MIRS-based rate adaptation system may provide almost 6 dB of performance gain as compared with non-MIRS-based schemes. The average power consumed to perform low-density parity check (LDPC) decoding per bit may be referred to as LDPC power efficiency. The maximum throughput that an LDPC decoder may process may be referred to as LDPC hardware dimensioning. Since MIRS-based rate adaptation system may have a large number of unsuccessful decoding attempts, the LDPC power efficiency of a MIRS scheme may consume almost four times more power per bit than a non-MIRS scheme. The LDPC maximal processing of a MIRS scheme may be seven times higher than a non-MIRS scheme. In other words, while the complexity of receiver components at a wireless device may not be affected when applying MIRS, the complexity of LDPC decoding may be increased when applying MIRS when the number of unsuccessful decoding attempts is high. Each failed LDPC decoding failed attempt may use a lot of power and resources.

A decoder success predictor method may be used to enable a UE to accurately identify code blocks that are likely to fail LDPC decoding. Such a UE may avoid decoding such identified code blocks, resulting in a significant reduction of power consumption and hardware dimensioning. Using such a method, a UE may save 15-30% in energy consumption per bit without increasing hardware dimensioning. A network node may also optimize scheduling MIRS retransmissions for such UEs while not violating the UE processing capabilities. In order to optimize a MIRS scheduling policy and meet the UE processing capabilities, a UE may use a decoder success predictor system to accurately identify code blocks which are likely to fail LDPC coding. The UE may then avoid decoding such code blocks. The UE may signal its decoder success prediction capability to a network node. Based on the received signaling, the network node may optimize MIRS retransmission scheduling. The decoder success prediction capability may include a prediction probability. The prediction probability may be characterized by a false alarm, or a probability for the UE to fail a decoding attempt even though the prediction probability predicted that the UE would succeed the decoding attempt. The prediction probability may be characterized by a mis-detection, or a probability for the UE to avoid a successful decoding by mistakenly predicting that it would not be successful at LDPC decoding. The UE may iteratively derive prediction probabilities, which may be provided to a network node as a probability percentage or decimal value less than one. The network node may optimize one or more MIRS parameters based on such prediction probabilities, such as optimizing a size of a retransmission, a maximal number of retransmissions, or a gap to a capacity threshold. This may reduce the complexity of LDPC attempts that are likely to fail. This may reduce the power consumption of the UE attempting to decode a transmission by skipping a decoding of transmissions with a high likelihood of failure.

A UE may transmit, to a network node, an indication of support for a decoder success prediction capability. The network node may obtain the indication of support by the UE for the decoder success prediction probability. The network node may output a transmission for the UE, where the transmission may include one or more parameters based on the support of the UE for the decoder success prediction probability. The UE may receive the transmission including one or more code blocks based on the indication of support for the decoder success prediction capability.

Figure 4:
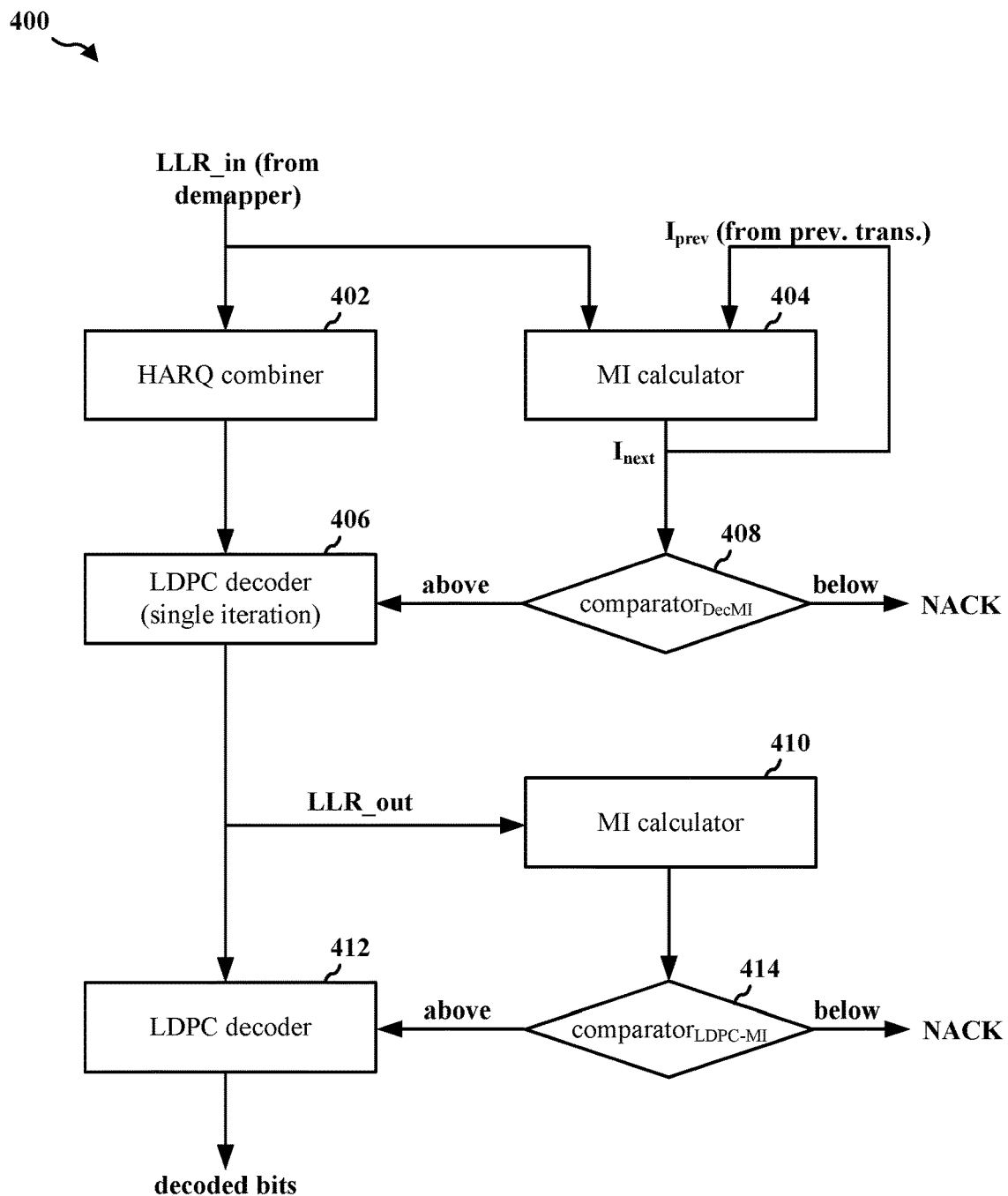
FIG. 4 is a diagram illustrating an example of a mutual information (MI)-based two-stage thresholding system for low-density parity check (LDPC) decoding, in accordance with various aspects of the present disclosure.

FIG. 4 is a diagram 400 illustrating an example of a mutual information (MI)-based two-stage thresholding system for LDPC decoding. An MI calculator 404 may use one or more log likelihood ratios (LLRs) to calculate MI for each code block of an incoming transmission. In one aspect, the LLR(s) may be based on a de-mapper configured to de-map the transmission. In one aspect, the LLR(s) may be based on a per-stream recursive demapping (PSRD) of the transmission.

The MI calculator 404 may use a reduced set of LLRs, or a decimated set of LLRs, based on the LLRs obtained from PSRD to calculate a numerical MI for a current transmission ($I_{next}$). By using a decimated set of LLRs, the power consumption of calculating the MI using the MI calculator 404 may be reduced. An LLR of a set of i LLRs may be calculated as $$LLR_i = \ln\left(\frac{p(0|y_i)}{p(1|y_i)}\right)$$

where $LLR_i$ is the i'th LLR from the set of LLRs used to calculate the MI. In other words, each LLR of a set of i LLRs may be calculated as the probability of each bit to be zero divided by the probability of each bit to be one. The probabilities may be calculated from the LLR as $$p(0|y_i) = \frac{1}{1 + \exp(LLR_i)}$$

while the denominator of $LLR_i$ may be calculated as $p(1|\gamma_i)=1-p(0|\gamma_i)$.

The MI calculator may use the LLRs and an MI calculated from a previous transmission ($I_{prev}$) to calculate a numerical MI for a current transmission ($I_{next}$). A numerical MI calculation for a set of LLRs may be calculated as:

$$I(x; y) = \sum_y \sum_x p(x, y) \log_2 \left( \frac{p(x, y)}{p(x)p(y)} \right)$$

$$I(x; y) = \sum_y \sum_x p(y)p(x|y) \log_2 \left( \frac{p(x|y)p(y)}{p(x)p(y)} \right)$$

$$I(x; y) = \sum_y p(y) \sum_{x \in \{0,1\}} p(x|y) \log_2(2 \times p(x|y))$$

$$I(x; y) = \frac{1}{N} \sum_{i=0}^{N-1} (p(0|y_i) \times \log_2(2 \times p(0|y_i)) + p(1|y_i) \times \log_2(2 \times p(1|y_i)))$$

A comparator$_{DecMI}$ 408 may compare the result $I_{next}$ from the MI calculator 404 with a first threshold ($T_{DecMI}$) to determine whether or not to perform an LDPC iteration. In response to the result $I_{next}$ from the MI calculator 404 being less than or equal to the first threshold $T_{DecMI}$, the comparator$_{DecMI}$ 408 may trigger an output of a NACK in response to the code block of the incoming transmission. In other words, in response to determining that the decoding likelihood of a code block is low, a decoder success predictor method may skip decoding of the code block. In response to the result $I_{next}$ from the MI calculator 404 being greater or equal to the first threshold $T_{DecMI}$, the comparator$_{DecMI}$ 408 may trigger decoding the code block of the incoming transmission using the LDPC decoder 406. In other words, in response to determining that the decoding likelihood of a code block is high, a decoder success predictor method may decode the code block.

The HARQ combiner 402 may use the one or more LLRs to attempt the decoding of a code block that may have previously failed. The HARQ combiner 402 may combine a previously received code block with IR-HARQ bits of the code block of the incoming transmission for decoding using the LDPC decoder 406. The LDPC decoder 406 may perform a single LDPC iteration of the code block of the incoming transmission with a soft decoder output.

The MI calculator 410 may use the soft decoder LLR output from the LDPC decoder 406 to calculate an updated numerical MI. A comparator$_{LDPC-MI}$ 414 may compare the result from the MI calculator 410 with a second threshold ($T_{LDPC-MI}$) to determine whether or not to continue to perform LDPC iterations. In response to the result from the MI calculator 410 being greater or equal to the second threshold $T_{LDPC-MI}$, the comparator$_{LDPC-MI}$ 414 may trigger an output of a NACK in response to the code block of the incoming transmission. In other words, in response to determining that the updated decoding likelihood of the code block is low, the decoder success predictor method may skip decoding of the code block. In response to the result from the MI calculator 410 being greater or equal to the second threshold $T_{LDPC-MI}$, the comparator$_{LDPC-MI}$ 414 may trigger continuing to decode the code block of the incoming transmission using the LDPC decoder 412. In other words, in response to determining that the updated decoding likelihood of the code block is high, the decoder success predictor method may continue to decode the code block using the LDPC decoder 412 to produce a set of decoded bits. The LDPC decoder 412 may be configured to continue decoding the code block from iteration #2, as iteration #1 may have been performed by the LDPC decoder 406.

Using a two-stage thresholding system, MIRS power efficiency may be improved with a minimal impact on performance. In one aspect, a two-stage thresholding system may increase the LDPC power efficiency by almost eight times per bit. A two-stage thresholding system may decrease the amount of power that a MIRS scheme uses to be less than the amount of power that a non-MIRS scheme uses. In one aspect, a two-stage thresholding system may decrease the MIRS power consumption per bit to be lower by about 55% as compared to a non-MIRS power consumption per bit. A two-stage thresholding system may decrease the LDPC maximal processing of a MIRS scheme to be similar to that of a non-MIRS scheme. In other words, using a two-stage thresholding system may allow a UE to apply a MIRS scheme without an increase in LDPC hardware dimensioning. In some aspects, the overall modem power consumption may be reduced by 28%. A two-stage thresholding system may degrade performance as compared to a system that does not have a two-stage thresholding system, as there may be some false positives or false negatives. However, such degradation may be negligible with an accurate decoder success predictor formula.

While a two-stage thresholding system is shown in FIG. 4, other thresholding systems may be used to optimize MIRS decoding at a UE, such as a one-stage thresholding system that performs LDPC decoding after a single threshold comparison, or a three-stage or four-stage thresholding system.

Figure 5:
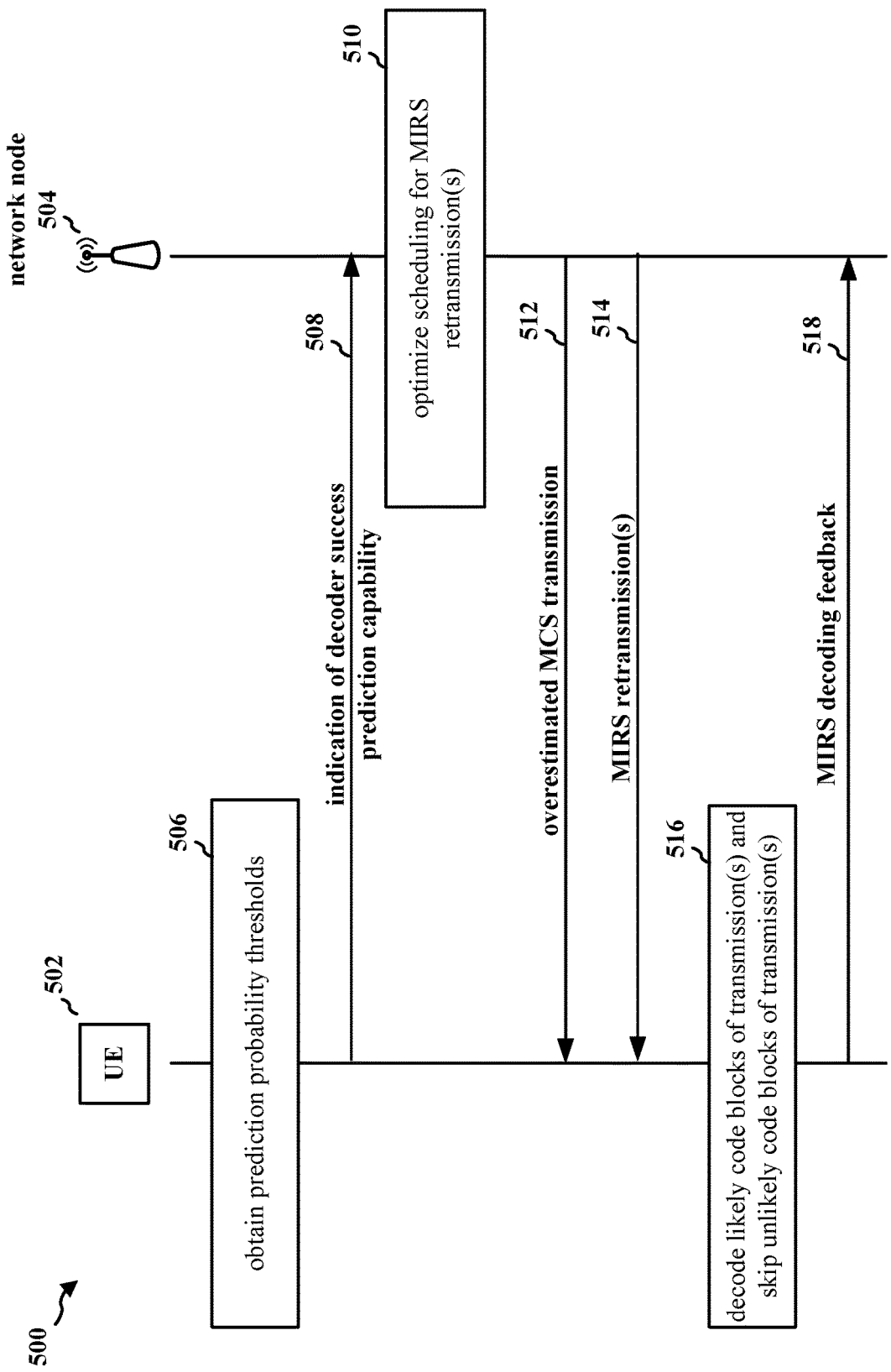
FIG. 5 is a connection flow diagram illustrating an example of a UE and a network node configured to optimize multiple incremental redundancy scheme (MIRS) scheduling and decoding, in accordance with various aspects of the present disclosure.

FIG. 5 is a connection flow diagram 500 illustrating an example of a UE 502 and a network node 504 configured to optimize MIRS scheduling and decoding, in accordance with various aspects of the present disclosure. At 506, the UE 502 obtains one or more prediction probability thresholds that may be used to determine a likelihood of decoding portions of transmission, such as code blocks of a transmission. For example, the UE 502 may obtain such thresholds by running a plurality of LDPC simulations to determine one or more optimal threshold levels. In one aspect, the UE 502 may obtain a $T_{DecMI}$ value of 0.33 and a $T_{LDPC-MI}$ value of 0.44.

The UE 502 transmits an indication 508 of its decoder success prediction capability to the network node 504. The network node obtains the indication 508 of the decoder success prediction capability from the UE 502. The UE 502 may transmit the indication 508 of its decoder success prediction capability as a UE capability report associated with the UE 502. The indication 508 of decoder success prediction capability may include a Boolean flag to indicate whether the UE 502 has a capability of predicting a probability of a code block that may succeed or fail decoding. In some aspects, the indication 508 of decoder success prediction capability may include one or more thresholds that the UE 502 uses to determine whether or not to perform an LDPC decoding, such as a first threshold ($T_{DecMI}$) for the comparator$_{DecMI}$ 408 in FIG. 4 and a second threshold ($T_{LDPC-MI}$) for the comparator$_{LDPC-MI}$ 414 in FIG. 4. In some aspects, the indication 508 of decoder success prediction capability may include one or more probabilities associated with the capability itself, such as a false alarm probability or a mis-detection probability. A false alarm probability may include a probability that the UE 502 may fail an attempt to decode a code block of an incoming transmission even if one or more comparators, such as the comparator$_{DecMI}$ 408 in FIG. 4 or the comparator$_{LDPC-MI}$ 414 in FIG. 4, indicates that the probability of success is high (e.g., greater than or equal to a threshold value). A mis-detection probability may include a probability that the UE 502 may avoid a successful decoding of a code block as a result of one or more comparators triggering a NACK response when the UE 502 would have successfully decoded the code block of the incoming transmission using an LDPC decoder. In some aspects, the indication 508 of decoder success prediction capability may include a set of probabilities for a failed decoding attempt associated with the decoder success prediction capability or a set of probabilities for a mis-detection associated with the decoder success prediction capability. Each of the set of probabilities may be associated with an MCS. For example, a first MCS may be associated with a high probability for a failed decoding attempt or mis-detection and a second MCS may be associated with a low probability for a failed decoding attempt or mis-detection.

At 510, the network node 504 optimizes a scheduling for one or more MIRS retransmissions to the UE 502 based on the indication 508 of decoder success prediction capability. In one aspect, the network node 504 may schedule MIRS retransmissions for the UE 502 in response to the UE 502 indicating that it has a capability of predicting a probability of a code block that may succeed or fail decoding, and may not schedule MIRS retransmissions (e.g., may instead schedule CSI-RS transmissions) for the UE 502 in response to the UE 502 indicating that it does not have a capability of predicting a probability of a code block that may succeed or fail decoding. In one aspect, the network node 504 may optimize MIRS retransmissions based on one or more threshold values received from the UE 502 by selecting one or more incremental values based on the one or more threshold values. In one aspect, the network node 504 may optimize MIRS retransmissions by adjusting at least one of a size of a retransmission, a maximum number of retransmissions, or an offset from a capacity threshold for the transmission (i.e., gap to capacity threshold) based on a prediction probability of the UE 502. In one aspect, the network node 504 may optimize scheduling for the one or more MIRS retransmissions 514 based on the prediction capability at UE 502 to adjust the LDPC complexity and a throughput and/or a capacity of the one or more MIRS retransmissions 514. In one aspect, the network node 504 may select an MCS for the initial transmission of the overestimated MCS transmission 512 or the retransmission of the overestimated MCS transmission 512 as the one or more MIRS retransmissions 514 based on at least one of a set of probabilities for a failed decoding attempt associated with the decoder success prediction capability or a set of probabilities for a mis-detection associated with the decoder success prediction capability. Each of the set of probabilities may be associated with an MCS. For example, in response to the UE prediction at the UE 502 having poor probability for a mis-detection value (e.g., a value that is below or equal to a threshold value) and/or for a failed decoding attempt value, the network node 504 may select a lower MCS to lower a number of failed attempts by the UE 502. Selecting a lower MCS may also reduce the capacity and power consumption by the UE 502. The network node 504 may make such a selection based on a threshold value for the mis-detection value or for the failed decoding attempt value.

The network node 504 may output an overestimated MCS transmission 512 to the UE 502. The UE 502 may receive the overestimated MCS transmission 512 from the network node 504. The network node may schedule the overestimated MCS transmission 512 using DCI or a MAC control element (MAC-CE). The DCI or MAC-CE may include an indication of an MCS. The network node 504 may select the overestimated MCS transmission 512 as an overestimation that the UE 502 will likely fail to decode to ensure that throughput is not lose due to an underestimated rate. The network node 504 may output one or more MIRS retransmissions 514 to the UE 502. The UE 502 may receive the one or more MIRS retransmissions 514. The network node may schedule one or more MIRS retransmissions 514 using one or more DCI or MAC-CE. The DCI or MAC-CE may include an indication of an MCS. The one or more MIRS retransmissions may include small IR-HARQ retransmissions for the UE 502 to perform fine, dynamic adaptation of the coding rate, based on the UE 502's ACK/NACK feedback. In other words, each time the UE 502 sends a NACK (or does not sent and ACK), the network node 504 may then transmit a small number of additional redundancy bits. The UE 502 may use code block feedback to maximize channel utilization further.

At 516, the UE 502 decodes likely code blocks of one or more transmissions received from the network node 504 (e.g., overestimated MCS transmission 512, one or more MIRS retransmissions 514), and skips unlikely code blocks of the transmissions received from the network node (e.g., overestimated MCS transmission 512, one or more MIRS retransmissions 514). A likely code block may be code blocks determined by the UE 502 to be likely to be correctly decoded code blocks (equal to or above a likelihood value threshold). An unlikely code block may be code blocks determined by the UE 502 to be unlikely to be correctly decoded code blocks (e.g., equal to or below a likelihood value threshold). The UE 502 may use a two-stage thresholding system, such as the two-stage thresholding system in FIG. 4, to determine whether to decode or skip certain code blocks of the transmission. By skipping the unlikely code blocks of the transmissions, the UE 502 may optimize its MIRS decoding process by minimizing power overhead while sifting through MIRS retransmissions to determine an optimal MCS for the UE 502.

The UE 502 may transmit MIRS decoding feedback 518 to the network node 504. The network node may obtain the MIRS decoding feedback 518 from the UE 502. The MIRS decoding feedback may include a series of ACK/NACK responses for one or more transmissions or one or more code blocks of the transmissions received by the UE 502.

Figure 6:
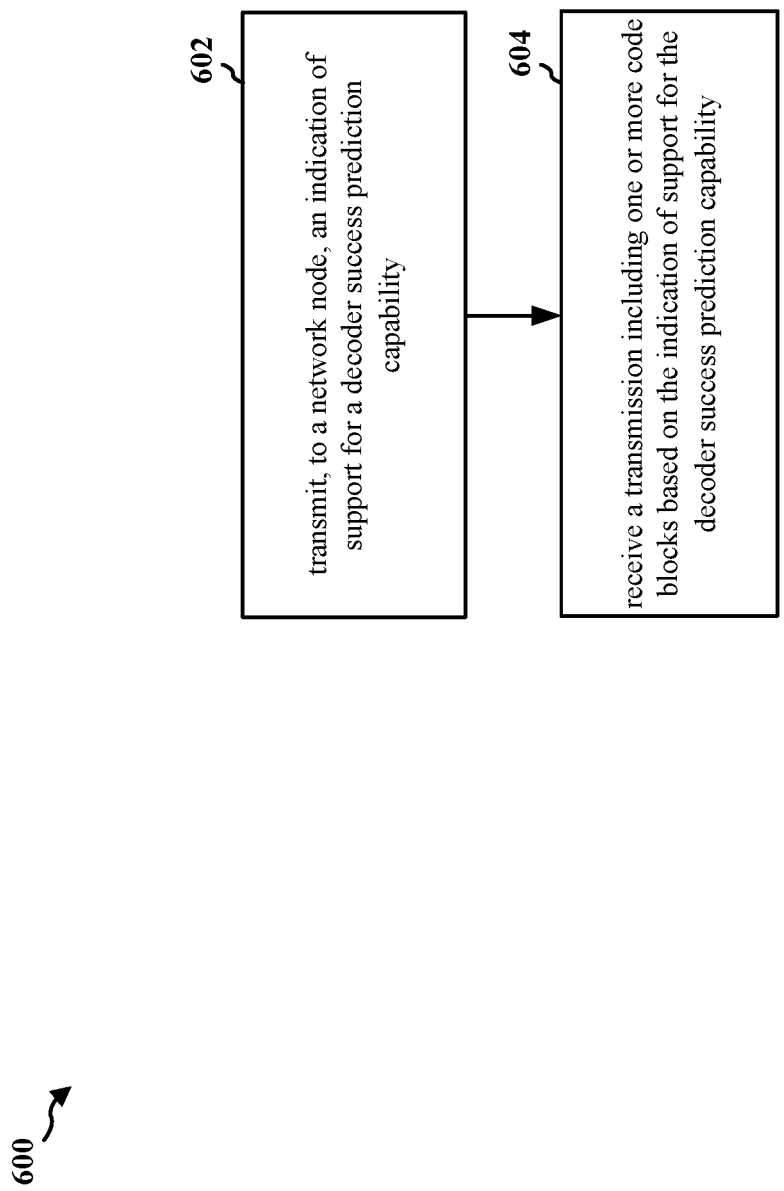
FIG. 6 is a flowchart of a method of wireless communication.

FIG. 6 is a flowchart 600 of a method of wireless communication. The method may be performed by a UE (e.g., the UE 104, the UE 350, the UE 502; the apparatus 1004). At 902, the UE transmits, to a network node, an indication of support for a decoder success prediction capability. For example, 602 may be performed by the UE 502 in FIG. 5, which may transmit, to the network node 504, an indication 508 of support for a decoder success prediction capability. Moreover, 602 may be performed by the MIRS decoding optimization component 198 of the apparatus 1004 in FIG. 10.

At 604, the UE receives a transmission including one or more code blocks based on the indication of support for the decoder success prediction capability. For example, 604 may be performed by the UE 502 in FIG. 5, which may receive one or more MIRS retransmissions 514 from the network node 504. The one or more MIRS retransmissions 514 may include one or more code blocks based on the indication 508 of support for the decoder success prediction capability. Moreover, 604 may be performed by the MIRS decoding optimization component 198 of the apparatus 1004 in FIG. 10.

Figure 7:
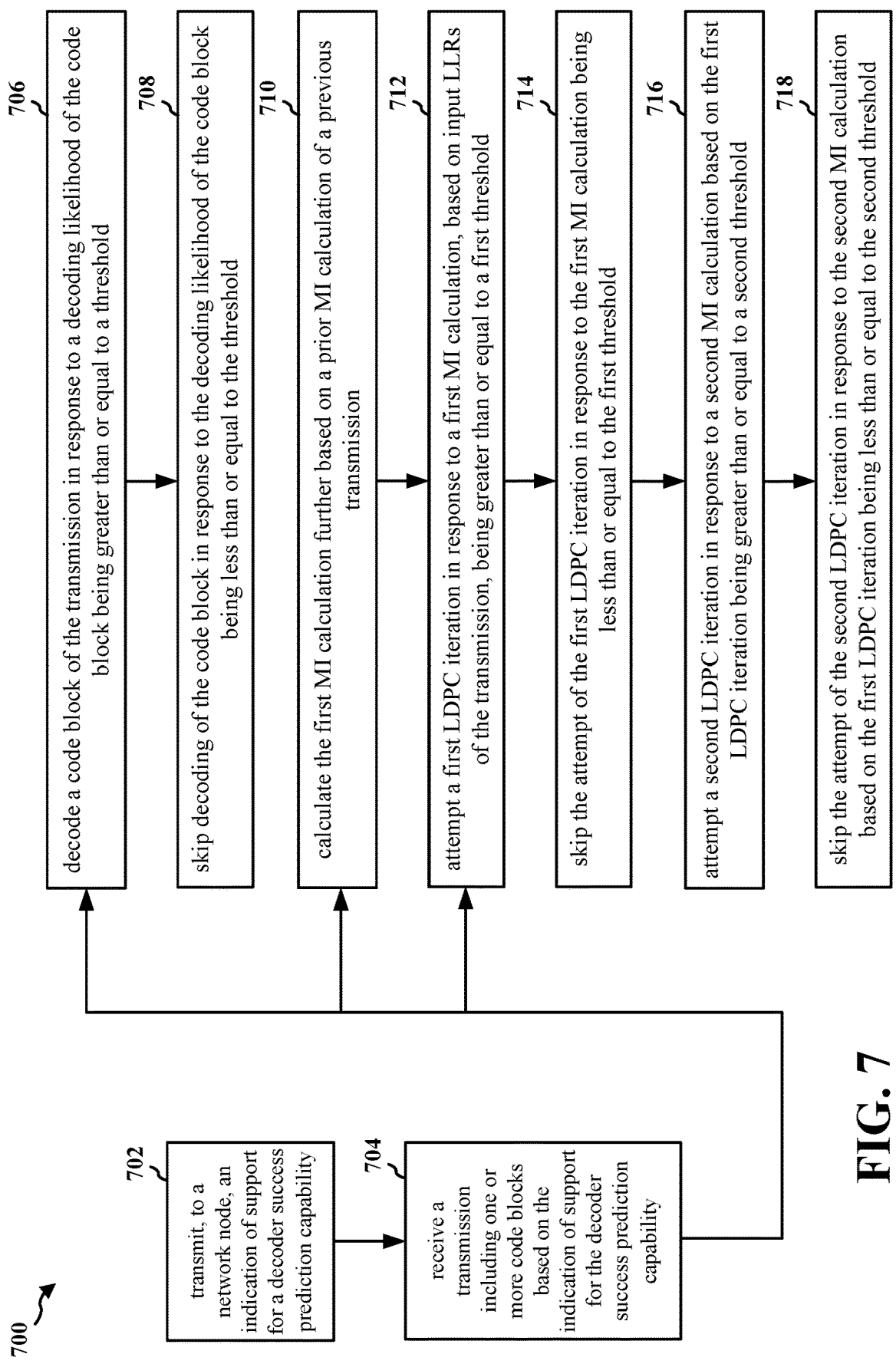
FIG. 7 is another flowchart of a method of wireless communication.

FIG. 7 is a flowchart 700 of a method of wireless communication. The method may be performed by a UE (e.g., the UE 104, the UE 350, the UE 502; the apparatus 1004). At 902, the UE transmits, to a network node, an indication of support for a decoder success prediction capability. For example, 702 may be performed by the UE 502 in FIG. 5, which may transmit, to the network node 504, an indication 508 of support for a decoder success prediction capability. Moreover, 702 may be performed by the MIRS decoding optimization component 198 of the apparatus 1004 in FIG. 10.

At 704, the UE receives a transmission including one or more code blocks based on the indication of support for the decoder success prediction capability. For example, 704 may be performed by the UE 502 in FIG. 5, which may receive one or more MIRS retransmissions 514 from the network node 504. The one or more MIRS retransmissions 514 may include one or more code blocks based on the indication 508 of support for the decoder success prediction capability. Moreover, 704 may be performed by the MIRS decoding optimization component 198 of the apparatus 1004 in FIG. 10.

At 706, the UE decodes a code block of the transmission in response to a decoding likelihood of the code block being greater than or equal to a threshold. For example, 706 may be performed by the UE 502 in FIG. 5, which may decode a code block of the transmission at 516 in response to a decoding likelihood of the code block being greater or equal to a threshold. Moreover, 706 may be performed by the MIRS decoding optimization component 198 of the apparatus 1004 in FIG. 10.

At 708, the UE skips the decoding of the code block in response to the decoding likelihood being less than or equal to the threshold. For example, 708 may be performed by the UE 502 in FIG. 5, which may skip the decoding of the code block at 516 in response to the decoding likelihood being less than or equal to the threshold (unlikely). Moreover, 708 may be performed by the MIRS decoding optimization component 198 of the apparatus 1004 in FIG. 10.

At 710, the UE calculates the first MI calculation further based on a prior MI calculation of a previous transmission. For example, 710 may be performed by the UE 502 in FIG. 5, which may calculate the first MI calculation at 516 further based on a prior MI calculation of a previous transmission, such as the value $I_{prev}$ in FIG. 4. A prior MI calculation may also be referred to as a second MI calculation or an additional MI calculation. Moreover, 710 may be performed by the MIRS decoding optimization component 198 of the apparatus 1004 in FIG. 10.

At 712, the UE attempts a first LDPC iteration in response to a first MI calculation, based on input LLRs of the transmission, being greater or equal to a first threshold. For example, 712 may be performed by the UE 502 in FIG. 5, which may attempt a first LDPC iteration at 516 using the LDPC decoder 406 in FIG. 4 in response to a first MI calculation, based on input LLRs of the transmission, being greater or equal to a first threshold, such as the $I_{next}$ value being greater or equal to the $I_{DecMI}$ value at the comparator$_{DecMI}$ 408 in FIG. 4. Moreover, 712 may be performed by the MIRS decoding optimization component 198 of the apparatus 1004 in FIG. 10.

At 714, the UE skips the attempt of the first LDPC iteration in response to the first MI calculation being less than or equal to the first threshold. For example, 714 may be performed by the UE 502 in FIG. 5, which may skip the attempt of the first LDPC iteration at 516 using the LDPC decoder in FIG. 4 in response to the first MI calculation being less than or equal to the first threshold, such as the $I_{next}$ value being less than or equal to the $I_{DecMI}$ value at the comparator$_{DecMI}$ 408 in FIG. 4. Moreover, 714 may be performed by the MIRS decoding optimization component 198 of the apparatus 1004 in FIG. 10.

At 716, the UE attempts a second LDPC iteration in response to a second MI calculation based on the first LDPC iteration being greater or equal to a second threshold. For example, 716 may be performed by the UE 502 in FIG. 5, which may attempt a second LDPC iteration at 516 using the LDPC decoder 412 in FIG. 4 in response to a second MI calculation based on the first LDPC iteration being greater or equal to a second threshold, such as the second MI calculation using MI calculator 410 being greater or equal to the second threshold $I_{LDPC-MI}$ at comparator$_{LDPC-MI}$ 414. Moreover, 716 may be performed by the MIRS decoding optimization component 198 of the apparatus 1004 in FIG. 10.

At 718, the UE skips the attempt of the second LDPC iteration in response to the second MI calculation based on the first LDPC iteration being less than or equal to the second threshold. For example, 718 may be performed by the UE 502 in FIG. 5, which may skip the attempt of the second LDPC iteration at 516 using the LDPC decoder 412 in FIG. 4 in response to the second MI calculation, based on the first LDPC iteration, being less than or equal to the second threshold, such as the second MI calculation using MI calculator 410 being less than or equal to the second threshold $I_{LDPC-MI}$ at comparator$_{LDPC-MI}$ 414. Moreover, 718 may be performed by the MIRS decoding optimization component 198 of the apparatus 1004 in FIG. 10.

Figure 8:
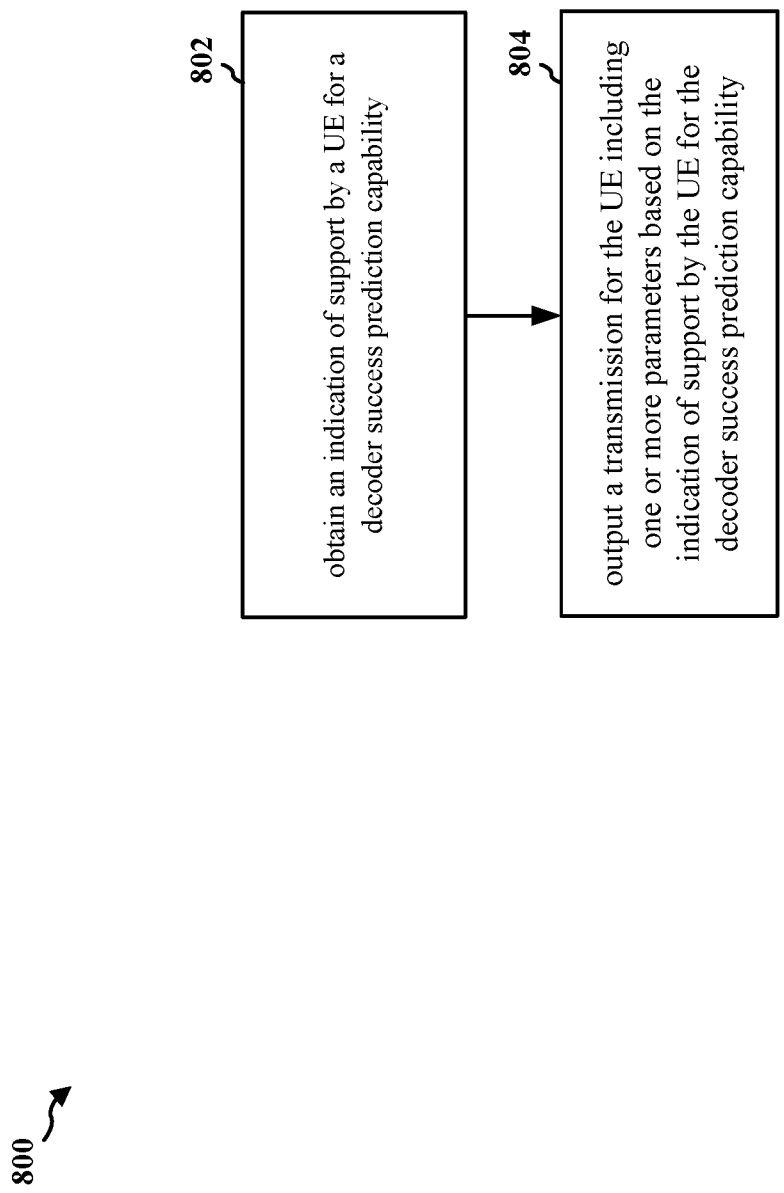
FIG. 8 is another flowchart of a method of wireless communication.

FIG. 8 is a flowchart 800 of a method of wireless communication. The method may be performed by a network node (e.g., the base station 102, the base station 310; the network node 504; the network entity 1002, the network entity 1102). At 802, the network node obtains an indication of support by a UE for a decoder success prediction capability. For example, 802 may be performed by the network node 504 in FIG. 5, which may obtain an indication 508 of decoder success prediction capability by the UE 502. Moreover, 802 may be performed by the MIRS scheduling optimization component 199 of the network entity in FIG. 11.

At 804, the network node outputs a transmission for the UE including one or more parameters based on the indication of support by the UE for the decoder success prediction capability. For example, 804 may be performed by the network node 504 in FIG. 5, which may output one or more MIRS retransmissions 514 for the UE 502 including one or more parameters based on the indication 508 of decoder success prediction capability obtained from the UE 502. Moreover, 804 may be performed by the MIRS scheduling optimization component 199 of the network entity in FIG. 11.

Figure 9:
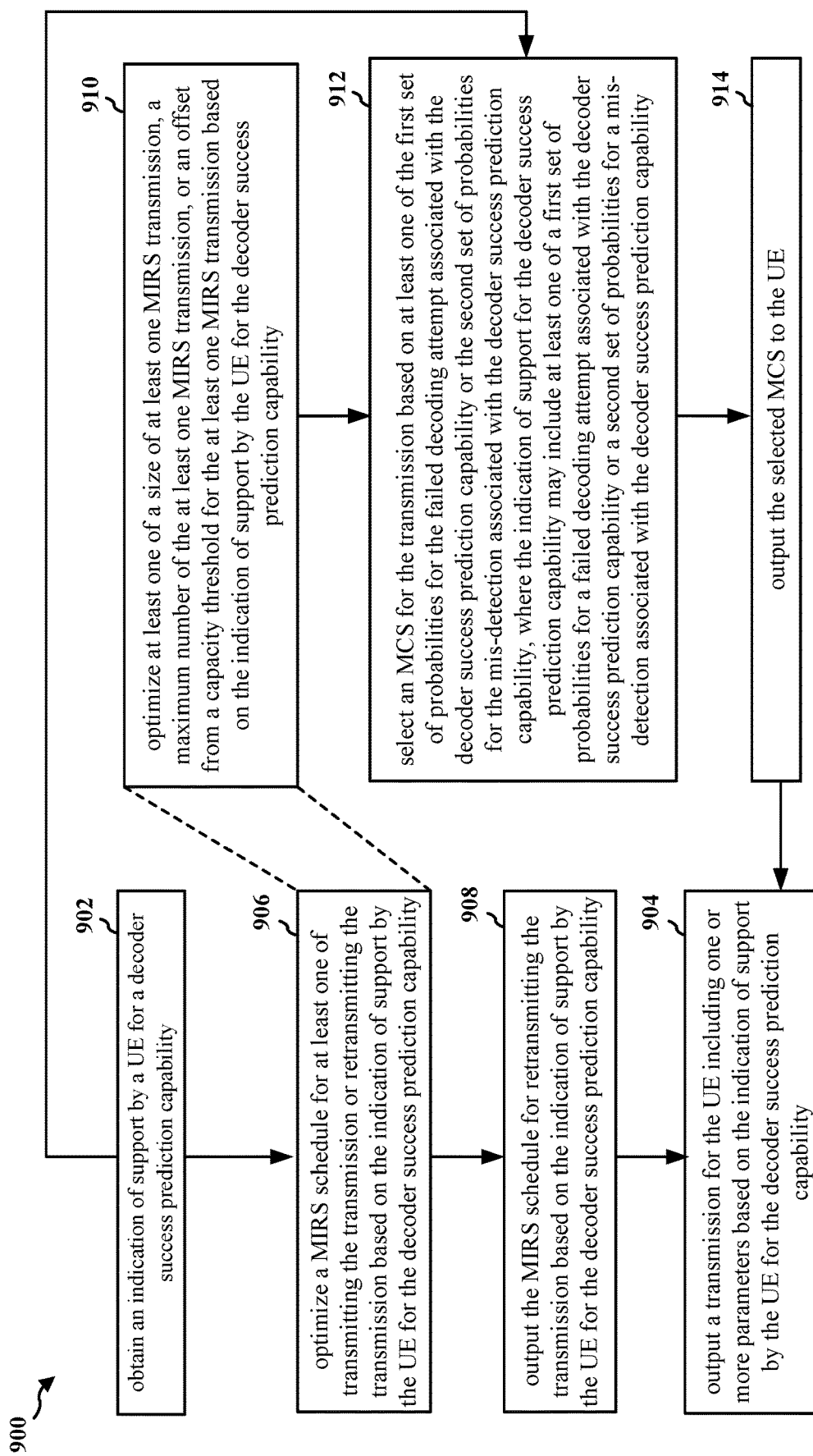
FIG. 9 is another flowchart of a method of wireless communication.

FIG. 9 is a flowchart 900 of a method of wireless communication. The method may be performed by a network node (e.g., the base station 102, the base station 310; the network node 504; the network entity 1002, the network entity 1102). At 902, the network node obtains an indication of support by a UE for a decoder success prediction capability. For example, 902 may be performed by the network node 504 in FIG. 5, which may obtain an indication 508 of decoder success prediction capability by the UE 502. Moreover, 902 may be performed by the MIRS scheduling optimization component 199 of the network entity in FIG. 11.

At 904, the network node outputs a transmission for the UE including one or more parameters based on the indication of support by the UE for the decoder success prediction capability. For example, 904 may be performed by the network node 504 in FIG. 5, which may output one or more MIRS retransmissions 514 for the UE 502 including one or more parameters based on the indication 508 of decoder success prediction capability obtained from the UE 502. Moreover, 904 may be performed by the MIRS scheduling optimization component 199 of the network entity in FIG. 11.

At 906, the network node optimizes a MIRS schedule for at least one of transmitting the transmission or retransmitting the transmission based on the indication of support by the UE for the decoder success prediction capability. For example, 906 may be performed by the network node 504 in FIG. 5, which may, at 510, optimize a MIRS schedule for transmitting the overestimated MCS transmission 512 or retransmitting the overestimated MCS transmission 512 as the one or more MIRS retransmissions 514 based on the indication 508 of decoder success probability obtained from the UE 502. Moreover, 906 may be performed by the MIRS scheduling optimization component 199 of the network entity in FIG. 11.

At 908, the network node outputs the MIRS schedule for retransmitting the transmission based on the indication of support by the UE for the decoder success prediction capability. For example, 908 may be performed by the network node 504 in FIG. 5, which may output the MIRS schedule for the one or more MIRS retransmissions 514 as DCI scheduling the one or more MIRS retransmissions 514. Outputting the MIRS schedule may be based on the indication 508 of decoder success prediction probability obtained from the UE 502. Moreover, 908 may be performed by the MIRS scheduling optimization component 199 of the network entity in FIG. 11.

At 910, the network node optimizes at least one of a size of at least one MIRS transmission, a maximum number of the at least one MIRS transmission, or an offset from a capacity threshold for the at least one MIRS transmission based on the indication of support by the UE for the decoder success prediction capability. For example, 910 may be performed by the network node 504 in FIG. 5, which may optimize at least one of a size of the one or more MIRS retransmissions 514, a maximum number of the one or more MIRS retransmissions 514, or an offset from a capacity threshold for the one or more MIRS retransmissions 514 based on the indication 508 of decoder success prediction capability obtained from the UE 502. Moreover, 910 may be performed by the MIRS scheduling optimization component 199 of the network entity in FIG. 11.

At 912, the network node selects an MCS for the transmission based on at least one of the first set of probabilities for the failed decoding attempt associated with the decoder success prediction capability or the second set of probabilities for the mis-detection associated with the decoder success prediction capability. The indication of support for the decoder success prediction capability may include at least one of a first set of probabilities for a failed decoding attempt associated with the decoder success prediction capability or a second set of probabilities for a mis-detection associated with the decoder success prediction capability. For example, 910 may be performed by the network node 504 in FIG. 5, which may, at 510, select an MCS for the overestimated MCS transmission 512 and/or the one or more MIRS retransmissions 514 based on at least one of the first set of probabilities for the failed decoding attempt associated with the decoder success prediction capability or the second set of probabilities for the mis-detection associated with the decoder success prediction capability. The indication 508 of decoder success prediction capability may include at least one of a first set of probabilities for a failed decoding attempt associated with the decoder success prediction capability or a second set of probabilities for a mis-detection associated with the decoder success prediction capability. Moreover, 910 may be performed by the MIRS scheduling optimization component 199 of the network entity in FIG. 11.

At 914, the network node outputs the selected MCS to the UE. For example, 910 may be performed by the network node 504 in FIG. 5, which may output the selected MCS to the UE as DCI scheduling the overestimated MCS transmission 512 or the one or more MIRS retransmissions 514. Moreover, 910 may be performed by the MIRS scheduling optimization component 199 of the network entity in FIG. 11.

Figure 10:
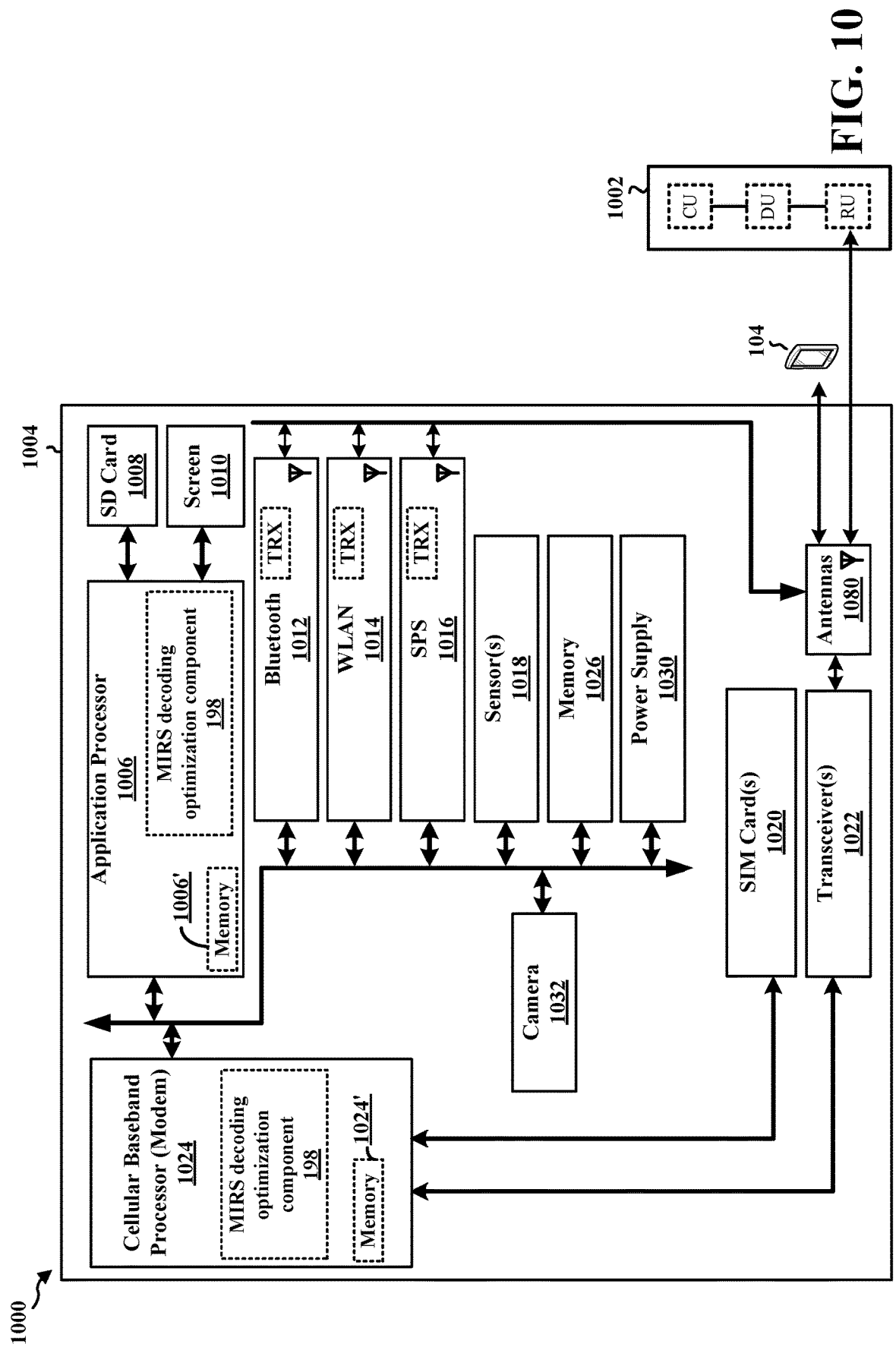
FIG. 10 is a diagram illustrating an example of a hardware implementation for an example apparatus and/or network entity.

FIG. 10 is a diagram 1000 illustrating an example of a hardware implementation for an apparatus 1004. The apparatus 1004 may be a UE, a component of a UE, or may implement UE functionality. In some aspects, the apparatus 1004 may include a cellular baseband processor 1024 (also referred to as a modem) coupled to one or more transceivers 1022 (e.g., cellular RF transceiver). The cellular baseband processor 1024 may include on-chip memory 1024'. In some aspects, the apparatus 1004 may further include one or more subscriber identity modules (SIM) cards 1020 and an application processor 1006 coupled to a secure digital (SD) card 1008 and a screen 1010. The application processor 1006 may include on-chip memory 1006'. In some aspects, the apparatus 1004 may further include a Bluetooth module 1012, a WLAN module 1014, an SPS module 1016 (e.g., GNSS module), one or more sensor modules 1018 (e.g., barometric pressure sensor/altimeter; motion sensor such as inertial management unit (IMU), gyroscope, and/or accelerometer(s); light detection and ranging (LIDAR), radio assisted detection and ranging (RADAR), sound navigation and ranging (SONAR), magnetometer, audio and/or other technologies used for positioning), a memory 1026, a power supply 1030, and/or a camera 1032. The Bluetooth module 1012, the WLAN module 1014, and the SPS module 1016 may include an on-chip transceiver (TRX) (or in some cases, just a receiver (Rx)). The Bluetooth module 1012, the WLAN module 1014, and the SPS module 1016 may include their own dedicated antennas and/or utilize the antennas 1080 for communication. The cellular baseband processor 1024 communicates through the transceiver(s) 1022 via one or more antennas 1080 with the UE 104 and/or with an RU associated with a network entity 1002. The cellular baseband processor 1024 and the application processor 1006 may each include a computer-readable medium/memory 1024', 1006', respectively. The memory 1026 may also be considered a computer-readable medium/memory. Each computer-readable medium/memory 1024', 1006', 1026 may be non-transitory. The cellular baseband processor 1024 and the application processor 1006 are each responsible for general processing, including the execution of software stored on the computer-readable medium/memory. The software, when executed by the cellular baseband processor 1024/application processor 1006, causes the cellular baseband processor 1024/application processor 1006 to perform the various functions described supra. The computer-readable medium/memory may also be used for storing data that is manipulated by the cellular baseband processor 1024/application processor 1006 when executing software. The cellular baseband processor 1024/application processor 1006 may be a component of the UE 350 and may include the memory 360 and/or at least one of the Tx processor 368, the Rx processor 356, and the controller/processor 359. In one configuration, the apparatus 1004 may be a processor chip (modem and/or application) and include just the cellular baseband processor 1024 and/or the application processor 1006, and in another configuration, the apparatus 1004 may be the entire UE (e.g., see UE 350 of FIG. 3) and include the additional modules of the apparatus 1004.

As discussed supra, the MIRS decoding optimization component 198 may be configured to transmit, to a network node, an indication of support for a decoder success prediction capability. The MIRS decoding optimization component 198 may be configured to receive a transmission including one or more code blocks based on the indication of support for the decoder success prediction capability. The MIRS decoding optimization component 198 may be within the cellular baseband processor 1024, the application processor 1006, or both the cellular baseband processor 1024 and the application processor 1006. The MIRS decoding optimization component 198 may be configured to perform any of the aspects described in connection with FIG. 4, 6, 7, and/or the aspects performed by the UE in FIG. 5. The MIRS decoding optimization component 198 may be one or more hardware components specifically configured to carry out the stated processes/algorithm, implemented by one or more processors configured to perform the stated processes/algorithm, stored within a computer-readable medium for implementation by one or more processors, or some combination thereof. As shown, the apparatus 1004 may include a variety of components configured for various functions. In one configuration, the apparatus 1004, and in particular the cellular baseband processor 1024 and/or the application processor 1006, includes means for transmitting, to a network node, an indication of support for a decoder success prediction capability, means for receiving a transmission including one or more code blocks based on the indication of support for the decoder success prediction capability, means for decoding a code block of the transmission in response to a decoding likelihood, of the code block, being greater or equal to a threshold, means for skipping the decoding of the code block in response to the decoding likelihood being less than or equal to the threshold, means for attempting a first LDPC iteration in response to a first MI calculation, based on input LLRs of the transmission, being greater or equal to a first threshold, means for skipping the first LDPC iteration in response to the first MI calculation being less than or equal to the first threshold, means for skipping the first LDPC iteration in response to the first MI calculation being less than or equal to the first threshold, means for skipping the second LDPC iteration in response to the second MI calculation based on the first LDPC iteration being less than or equal to the second threshold, and means for calculating the first MI calculation further based on a prior MI calculation of a previous transmission. The apparatus 1004 may include means for performing any of the aspects described in connection with FIG. 4, 6, 7, and/or the aspects performed by the UE in FIG. 5. The means may be the MIRS decoding optimization component 198 of the apparatus 1004 configured to perform the functions recited by the means. As described supra, the apparatus 1004 may include the Tx processor 368, the Rx processor 356, and the controller/processor 359. As such, in one configuration, the means may be the Tx processor 368, the Rx processor 356, and/or the controller/processor 359 configured to perform the functions recited by the means.

Figure 11:
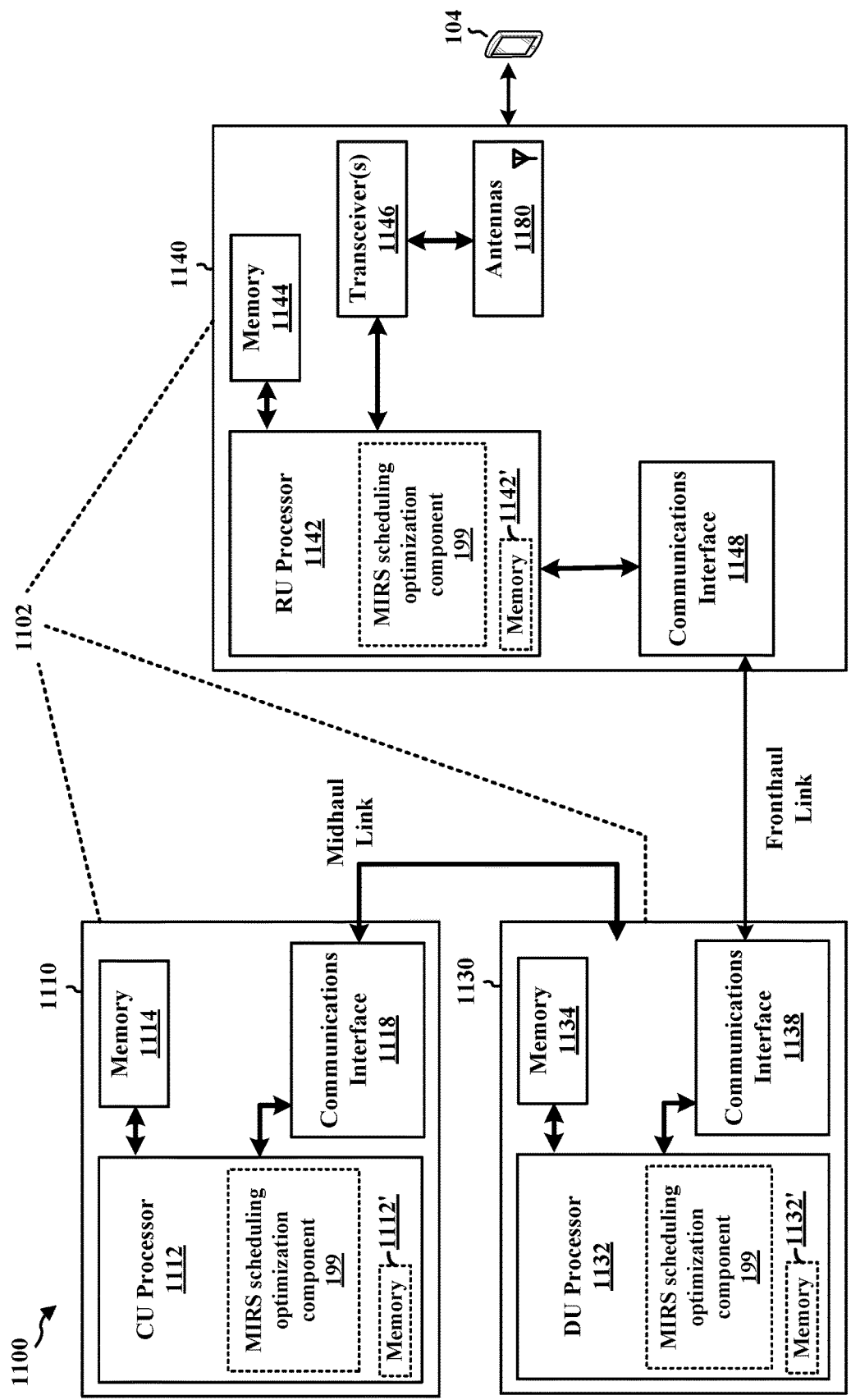
FIG. 11 is a diagram illustrating an example of a hardware implementation for an example network entity.

FIG. 11 is a diagram 1100 illustrating an example of a hardware implementation for a network entity 1102. The network entity 1102 may be a BS, a component of a BS, or may implement BS functionality. The network entity 1102 may include at least one of a CU 1110, a DU 1130, or an RU 1140. For example, depending on the layer functionality handled by the MIRS scheduling optimization component 199, the network entity 1102 may include the CU 1110; both the CU 1110 and the DU 1130; each of the CU 1110, the DU 1130, and the RU 1140; the DU 1130; both the DU 1130 and the RU 1140; or the RU 1140. The CU 1110 may include a CU processor 1112. The CU processor 1112 may include on-chip memory 1112'. In some aspects, the CU 1110 may further include memory 1114 and a communications interface 1118. The CU 1110 communicates with the DU 1130 through a midhaul link, such as an F1 interface. The DU 1130 may include a DU processor 1132. The DU processor 1132 may include on-chip memory 1132'. In some aspects, the DU 1130 may further include memory 1134 and a communications interface 1138. The DU 1130 communicates with the RU 1140 through a fronthaul link. The RU 1140 may include an RU processor 1142. The RU processor 1142 may include on-chip memory 1142'. In some aspects, the RU 1140 may further include memory 1144, one or more transceivers 1146, antennas 1180, and a communications interface 1148. The RU 1140 communicates with the UE 104. The on-chip memory 1112', 1132', 1142' and the memory 1114, 1134, 1144 may each be considered a computer-readable medium/memory. Each computer-readable medium/memory may be non-transitory. Each of the processors 1112, 1132, 1142 is responsible for general processing, including the execution of software stored on the computer-readable medium/memory. The software, when executed by the corresponding processor(s) causes the processor(s) to perform the various functions described supra. The computer-readable medium/memory may also be used for storing data that is manipulated by the processor(s) when executing software.

As discussed supra, the MIRS scheduling optimization component 199 is configured to obtain an indication of support by a UE for a decoder success prediction capability. The MIRS scheduling optimization component 199 may be configured to output a transmission for the UE including one or more parameters based on the support of the UE for the decoder success prediction capability. The MIRS scheduling optimization component 199 may be configured to perform any of the aspects described in connection with FIG. 8, 9, and/or the aspects performed by the network node in FIG. 5. The MIRS scheduling optimization component 199 may be within one or more processors of one or more of the CU 1110, DU 1130, and the RU 1140. The MIRS scheduling optimization component 199 may be one or more hardware components specifically configured to carry out the stated processes/algorithm, implemented by one or more processors configured to perform the stated processes/algorithm, stored within a computer-readable medium for implementation by one or more processors, or some combination thereof. The network entity 1102 may include a variety of components configured for various functions. In one configuration, the network entity 1102 includes means for obtaining an indication of support by a UE for a decoder success prediction capability, means for outputting a transmission for the UE including one or more parameters based on the support of the UE for the decoder success prediction capability, means for optimizing scheduling for at least one MIRS retransmission for the transmission based on the support of the UE for the decoder success prediction capability, means for optimizing at least one of a size of the at least one MIRS retransmission, a maximum number of the at least one MIRS retransmission, or an offset from a capacity threshold for the at least one MIRS retransmission based on the support of the UE for the decoder success prediction capability, means for optimizing scheduling for the at least one MIRS retransmission by minimizing a probability for the failed decoding attempt, and means for optimizing scheduling for the at least one MIRS retransmission by minimizing the probability for the mis-detection. The network entity 1102 may include means for performing any of the aspects described in connection with FIG. 8, 9, and/or the aspects performed by the network node in FIG. 5. The means may be the MIRS scheduling optimization component 199 of the network entity 1102 configured to perform the functions recited by the means. As described supra, the network entity 1102 may include the Tx processor 316, the Rx processor 370, and the controller/processor 375. As such, in one configuration, the means may be the Tx processor 316, the Rx processor 370, and/or the controller/processor 375 configured to perform the functions recited by the means.

It is understood that the specific order or hierarchy of blocks in the processes/flowcharts disclosed is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not limited to the aspects described herein, but are to be accorded the full scope consistent with the language claims. Reference to an element in the singular does not mean "one and only one" unless specifically so stated, but rather "one or more." A "set" or a "subset" of elements includes one or more elements (i.e., at least one element or a plurality of elements). Terms such as "if," "when," and "while" do not imply an immediate temporal relationship or reaction. That is, these phrases, e.g., "when," do not imply an immediate action in response to or during the occurrence of an action, but simply imply that if a condition is met then an action will occur, but without requiring a specific or immediate time constraint for the action to occur. The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. Sets should be interpreted as a set of elements where the elements number one or more. Accordingly, for a set of X, X would include one or more elements. If a first apparatus receives data from or transmits data to a second apparatus, the data may be received/transmitted directly between the first and second apparatuses, or indirectly between the first and second apparatuses through a set of apparatuses. All structural and functional equivalents to the elements of the various aspects described throughout this disclosure that are known or later come to be known to those of ordinary skill in the art are expressly incorporated herein by reference and are encompassed by the claims. Moreover, nothing disclosed herein is dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

As used herein, the phrase "based on" shall not be construed as a reference to a closed set of information, one or more conditions, one or more factors, or the like. In other words, the phrase "based on A" (where "A" may be information, a condition, a factor, or the like) shall be construed as "based at least on A" unless specifically recited differently.

A device configured to "output" data, such as a transmission, signal, or message, may transmit the data, for example with a transceiver, or may send the data to a device that transmits the data. A device configured to "obtain" data, such as a transmission, signal, or message, may receive, for example with a transceiver, or may obtain the data from a device that receives the data.

The following aspects are illustrative only and may be combined with other aspects or teachings described herein, without limitation.

Aspect 1 is a method of wireless communication at a UE, where the method may include transmitting, to a network node, an indication of support for a decoder success prediction capability. The method may include receiving a transmission including one or more code blocks based on the indication of support for the decoder success prediction capability.

Aspect 2 is the method of aspect 1, where, for each code block of the one or more code blocks, the method may include decoding a code block of the transmission in response to a decoding likelihood of the code block being greater than or equal to a threshold. For each of the one or more code blocks, the method may include skipping the decoding of the code block in response to the decoding likelihood of the code block being less than or equal to the threshold.

Aspect 3 is the method of any of aspects 1 to 2, where the method may include attempting a first LDPC iteration in response to a first MI calculation, based on input log likelihood ratios (LLRs) of the transmission, being greater or equal to a first threshold. The method may include skipping the attempt of the first LDPC iteration in response to the first MI calculation being less than or equal to the first threshold.

Aspect 4 is the method of aspect 3, where the method may include attempting a second LDPC iteration in response to a second MI calculation based on the first LDPC iteration being greater or equal to a second threshold. The method may include skipping the attempt of the second LDPC iteration in response to the second MI calculation based on the first LDPC iteration being less than or equal to the second threshold.

Aspect 5 is the method of aspect 4, where at least one of the first MI calculation or the second MI calculation may be based on a reduced set of LLRs.

Aspect 6 is the method of any of aspects 3 to 5, where the input LLRs may be based on a demapper output of the transmission.

Aspect 7 is the method of any of aspects 3 to 6, where the method may include calculating the first MI calculation further based on a prior MI calculation of a previous transmission.

Aspect 8 is the method of any of aspects 1 to 7, where the transmission may include scheduling for a MIRS retransmission.

Aspect 9 is the method of any of aspects 1 to 8, where at least one of a size of a retransmission, a maximum number of retransmissions, or an offset from a capacity threshold for the transmission may be based on the support of the UE for the decoder success prediction capability.

Aspect 10 is the method of any of aspects 1 to 9, where the indication of support for the decoder success prediction capability may include at least one of a first set of probabilities for a failed decoding attempt associated with the decoder success prediction capability or a second set of probabilities for a mis-detection associated with the decoder success prediction capability.

Aspect 11 is the method of aspect 10, where the first set of probabilities for the failed decoding attempt associated with the decoder success prediction capability may include a first probability for the failed decoding attempt for each of a set of MCSs. The second set of probabilities for the mis-detection associated with the decoder success prediction capability may include a second probability for the mis-detection for each of the set of MCSs.

Aspect 12 is the method of aspect 10, where the method may include obtaining a second indication of an MCS for the transmission selected based on at least one of the first set of probabilities for the failed decoding attempt associated with the decoder success prediction capability or the second set of probabilities for the mis-detection associated with the decoder success prediction capability.

Aspect 13 is a method of wireless communication at a network node, where the method may include obtaining an indication of support by a UE for a decoder success prediction capability. The method may include outputting a transmission for the UE including one or more parameters based on the indication of support by the UE for the decoder success prediction capability.

Aspect 14 is the method of aspect 13, where the method may include optimizing a MIRS schedule for at least one of transmitting the transmission or retransmitting the transmission based on the indication of support by the UE for the decoder success prediction capability.

Aspect 15 is the method of aspect 14, where the method may include outputting the MIRS schedule for retransmitting the transmission based on the indication of support by the UE for the decoder success prediction capability.

Aspect 16 is the method of aspect 15, where optimizing the MIRS schedule for at least one of transmitting the transmission or retransmitting the transmission may include optimizing at least one of a size of at least one MIRS transmission, a maximum number of the at least one MIRS transmission, or an offset from a capacity threshold for the at least one MIRS transmission based on the indication of support by the UE for the decoder success prediction capability.

Aspect 17 is the method of any of aspects 13 to 16, where the indication of support for the decoder success prediction capability may include at least one of a first set of probabilities for a failed decoding attempt associated with the decoder success prediction capability or a second set of probabilities for a mis-detection associated with the decoder success prediction capability.

Aspect 18 is the method of any of aspects 13 to 17, where the first set of probabilities for the failed decoding attempt associated with the decoder success prediction capability may include a first probability for the failed decoding attempt for each of a set of MCSs. The second set of probabilities for the mis-detection associated with the decoder success prediction capability may include a second probability for the mis-detection for each of the set of MCSs.

Aspect 19 is the method of any of aspects 13 to 18, where the method may include selecting an MCS for the transmission based on at least one of the first set of probabilities for the failed decoding attempt associated with the decoder success prediction capability or the second set of probabilities for the mis-detection associated with the decoder success prediction capability.

Aspect 20 is the method of any of aspects 13 to 19, where the method may include outputting the selected MCS to the UE prior to outputting the transmission.

Aspect 21 is an apparatus for wireless communication, including: a memory; and at least one processor coupled to the memory and, based at least in part on information stored in the memory, the at least one processor is configured to implement any of aspects 1 to 20.

Aspect 22 is the apparatus of aspect 21, further including at least one of an antenna or a transceiver coupled to the at least one processor.

Aspect 23 is an apparatus for wireless communication including means for implementing any of aspects 1 to 20.

Aspect 24 is a computer-readable medium (e.g., a non-transitory computer-readable medium) storing computer executable code, where the code when executed by a processor causes the processor to implement any of aspects 1 to 20.

What is claimed is:

1. An apparatus for wireless communication at a user equipment (UE) comprising:
    at least one memory; and
    at least one processor coupled to the at least one memory and, based at least in part on information stored in the at least one memory, the at least one processor is configured to:
        transmit, to a network node, an indication that the UE skips decoding of code blocks based on a decoder success prediction capability; and
        receive, from the network node in response to the indication, a transmission including one or more code blocks based on the indication that the UE skips decoding of code blocks based on the decoder success prediction capability, wherein, for each code block of the one or more code blocks, the at least one processor is further configured to:
            calculate a decoding likelihood of the code block based on at least one of an input log likelihood ratio (LLR) of the transmission or a first low density parity check (LDPC) iteration of the transmission; and
            decode the code block of the transmission in response to the calculated decoding likelihood of the code block being greater than a threshold; or
            skip decoding of the code block in response to the calculated decoding likelihood of the code block being less than the threshold.

2. The apparatus of claim 1,
    wherein, to calculate the decoding likelihood of the code block, the at least one processor is further configured to calculate a first mutual information (MI) calculation based on the input LLR;

wherein, to decode the code block of the transmission, the at least one processor is further configured to attempt the first LDPC iteration in response to the first MI calculation being greater than the threshold;

wherein, to skip decoding the code block of the transmission, the at least one processor is further configured to skip the attempt of the first LDPC iteration in response to the first MI calculation being less than the threshold.

3. The apparatus of claim 2, wherein the at least one processor is further configured to:
calculate a second MI calculation based on a second LLR of the first LDPC iteration;
attempt a second LDPC iteration in response to the second MI calculation being greater than a second threshold; and
skip the attempt of the second LDPC iteration in response to the second MI calculation being less than the second threshold.

4. The apparatus of claim 3, wherein at least one of the first MI calculation or the second MI calculation is based on a reduced set of LLRs.

5. The apparatus of claim 2, wherein the input LLR is based on a demapper output of the transmission.

6. The apparatus of claim 2, wherein the at least one processor is further configured to:
calculate the first MI calculation further based on a prior MI calculation of a previous transmission.

7. The apparatus of claim 1, further comprising a transceiver coupled to the at least one processor, wherein the at least one processor is further configured to:
receive, via the transceiver, a schedule for a multiple incremental redundancy scheme (MIRS) retransmission of the transmission in response to the indication that the UE skips decoding of code blocks based on the decoder success prediction capability.

8. The apparatus of claim 1, wherein at least one of a size of a retransmission of the transmission, a maximum number of retransmissions of the transmission, or an offset from a capacity threshold for the transmission is based on the indication that the UE skips decoding of code blocks based on the decoder success prediction capability.

9. The apparatus of claim 1, wherein the indication that the UE skips decoding of code blocks based on the decoder success prediction capability comprises at least one of a first set of probabilities for a failed decoding attempt associated with the decoder success prediction capability or a second set of probabilities for a mis-detection associated with the decoder success prediction capability.

10. The apparatus of claim 9, wherein the first set of probabilities for the failed decoding attempt associated with the decoder success prediction capability comprises a first probability for the failed decoding attempt for each of a set of modulation and coding schemes (MCSs) or the second set of probabilities for the mis-detection associated with the decoder success prediction capability comprises a second probability for the mis-detection for each of the set of MCSs.

11. The apparatus of claim 9, wherein the at least one processor is further configured to:
obtain a second indication of a modulation and coding scheme (MCS) for the transmission selected based on at least one of the first set of probabilities for the failed decoding attempt associated with the decoder success prediction capability or the second set of probabilities for the mis-detection associated with the decoder success prediction capability.

12. A method of wireless communication at a user equipment (UE), comprising:
transmitting, to a network node, an indication that the UE skips decoding of code blocks based on a decoder success prediction capability; and
receiving, from the network node in response to the indication, a transmission including one or more code blocks based on the indication that the UE skips decoding of code blocks based on the decoder success prediction capability, wherein, for each code block of the one or more code block, the method further comprises:
calculating a decoding likelihood of the code block based on at least one of an input log likelihood ratio (LLR) of the transmission or a first low density parity check (LDPC) iteration of the transmission; and
decoding the code block of the transmission in response to the calculated decoding likelihood of the code block being greater than a threshold; or
skipping the decoding of the code block in response to the calculated decoding likelihood of the code block being less than the threshold.

13. The method of claim 12,
wherein calculating the decoding likelihood of the code block comprises calculating a first mutual information (MI) calculation based on the input LLR;
wherein decoding the code block of the transmission comprises attempting the first LDPC iteration in response to the first MI calculation being greater than the threshold;
wherein skipping the decoding of the code block of the transmission comprises skipping the attempt of the first LDPC iteration in response to the first MI calculation being less than the first threshold.

14. The method of claim 13, further comprising:
calculating a second MI calculation based on a second LLR of the first LDPC iteration;
attempting a second LDPC iteration in response to the second MI calculation being greater than a second threshold; and
skipping the second LDPC iteration in response to the second MI calculation being less than the second threshold.

15. The method of claim 13, further comprising:
receiving a schedule for a multiple incremental redundancy scheme (MIRS) retransmission of the transmission in response to the indication that the UE skips decoding of code blocks based on the decoder success prediction capability.

16. The method of claim 13, wherein at least one of a size of a retransmission of the transmission, a maximum number of retransmissions of the transmission, or an offset from a capacity threshold for the transmission is based on the indication that the UE skips decoding of code blocks based on the decoder success prediction capability.

* * * * *